United States Patent
Yater et al.

(10) Patent No.: US 8,969,940 B1
(45) Date of Patent: Mar. 3, 2015

(54) METHOD OF GATE STRAPPING IN SPLIT-GATE MEMORY CELL WITH INLAID GATE

(71) Applicant: Freescale Semiconductor, Inc., Austin, TX (US)

(72) Inventors: Jane A Yater, Austin, TX (US); Cheong Min Hong, Austin, TX (US); Sung-Taeg Kang, Austin, TX (US); Asanga H Perera, West Lake Hills, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/048,570

(22) Filed: Oct. 8, 2013

(51) Int. Cl.
| | |
|---|---|
| H01L 29/76 | (2006.01) |
| H01L 29/788 | (2006.01) |
| H01L 21/8238 | (2006.01) |
| H01L 27/115 | (2006.01) |

(52) U.S. Cl.
CPC .... *H01L 27/11563* (2013.01); *H01L 27/11517* (2013.01)
USPC .......... 257/314; 257/315; 257/E29.129; 257/E29.3; 438/211; 438/257; 438/259

(58) Field of Classification Search
CPC .............. H01L 27/11563; H01L 27/11517
USPC ............ 257/314, 315, E29.129, E29.3; 438/211, 257, 259
See application file for complete search history.

(56) References Cited

U.S. PATENT DOCUMENTS

| | | | |
|---|---|---|---|
| 6,566,706 B1 | 5/2003 | Wang et al. | |
| 7,524,719 B2 | 4/2009 | Steimle et al. | |
| 2008/0019178 A1* | 1/2008 | Yater et al. | 365/185.05 |
| 2009/0111229 A1 | 4/2009 | Steimle et al. | |

OTHER PUBLICATIONS

Asanga H. Perera, U.S. Appl. No. 13/962,338, filed Aug. 8, 2013, entitled Nonvolatile Memory Bitcell with Inlaid High K Metal Select Gate.

* cited by examiner

*Primary Examiner* — David S Blum
(74) *Attorney, Agent, or Firm* — Terrile, Cannatti, Chambers & Holland, LLP; Michael Rocco Cannatti

(57) ABSTRACT

A process integration is disclosed for fabricating non-volatile memory (NVM) cells having patterned select gates (211, 213), charge storage layers (219), inlaid control gates (223, 224), and inlaid control gate contact regions (228).

20 Claims, 7 Drawing Sheets

METHOD OF GATE STRAPPING IN SPLIT-GATE MEMORY CELL WITH INLAID GATE

BACKGROUND OF THE INVENTION

1. Field of the Invention

The present invention is directed in general to integrated circuit devices and methods for manufacturing same. In one aspect, the present invention relates to the fabrication of CMOS metal gate devices and non-volatile memory devices integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. While the introduction of novel gate stack materials for forming high-k metal gate stacks using gate last processes has improved device performance and reduced feature sizes for transistor devices, there are a number of integration options and challenges associated with the integration of such novel materials with existing polysilicon nanocrystal thin film storage bitcells. For example, as the dimensions of transistors decrease, the height of the conventional gate stacks used to form NVM bitcells has been reduced to prevent the "gate last" processing steps from damaging the NVM bitcell gates. In addition, the smaller device dimensions can create reliability concerns from shorting between select gate contacts and control gate contacts that are not sufficiently isolated from one another.

BRIEF DESCRIPTION OF THE DRAWINGS

The present invention may be understood, and its numerous objects, features and advantages obtained, when the following detailed description is considered in conjunction with the following drawings, in which.

Figure 1:
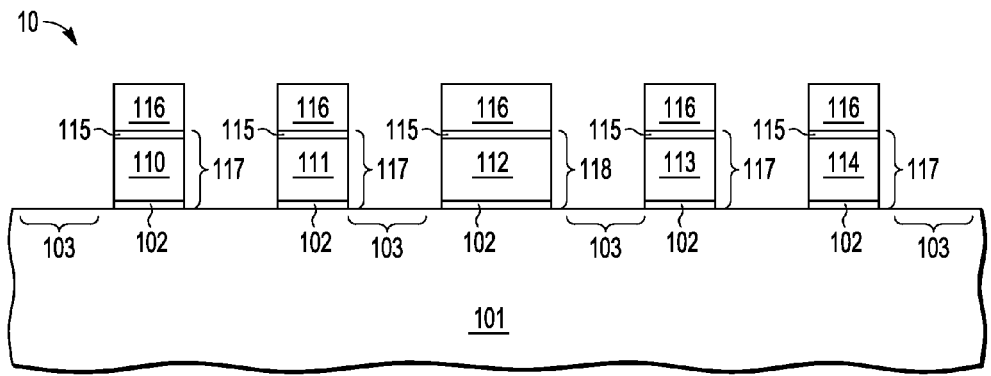
FIGS. 1-6 show a first example semiconductor device during successive phases of a fabrication sequence for forming split-gate thin film storage non-volatile memory bitcells with inlaid control gates.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact split-gate thin film storage (TFS) non-volatile memory (NVM) bitcell with inlaid control gates and strapped or end cell contacts and associated fabrication process are disclosed in which the NVM bitcells are formed with strapped select gates and inlaid control gates that may be formed using a CMOS gate-last fabrication sequence to form flash cells with HKMG transistor gates. After forming a poly layer over at least an NVM area of a wafer, one or more etch processes are applied to define a plurality of poly select gates along with one or more dummy poly select gates which are spaced apart from one another to define a plurality of control gate areas. A charge storage layer (e.g., a nanocrystal stack) may then be formed over the poly select gates and dummy poly select gates and in the control gate areas, followed by the deposition and planarization of a control gate poly layer to fill the control gate areas between the poly select gates and dummy poly select gates, thereby forming a plurality of inlaid control gates, dummy control gates, and strap cell or end cap contact regions. After patterning the wafer substrate with one or more additional etch masks, one or more etch processes are applied to remove the dummy control gate(s) and dummy poly select gate(s), and the exposed drain and source regions may then be implanted to form the split-gate TFS NVM bitcells. By using dummy poly select gates to form the inlaid control gates, the control gate line width and gate edge placement may be carefully controlled. In addition, the placement of dummy poly select gate elements at the end of an array may be used to define and delineate control gate and select gate strap regions with good isolation therebetween. In other embodiments, the dummy poly select gates may be patterned to include a break or opening in which the deposited and planarized control gate poly layer forms a control gate interconnect which may be used for a control gate contact. Selected embodiments of the disclosed integration scheme fabricate split-gate TFS NVM bitcells with inlaid control gates and strap cell or end cap contact regions by depositing a polysilicon layer over patterned select gates and dummy select gates on which a nanocrystal stack layer and barrier metal layer are formed, and then polishing and recessing the polysilicon layer with a chemical mechanical polish step, alone or in combination with a recess etch step, thereby forming inlaid control gates (including dummy control gates) and inlaid strap cell or end cap contact regions. Subsequently, the NVM area is patterned and etched with a first etch mask to remove the dummy control gates and any underlying charge storage layer, thereby exposing substrate drain regions for implantation. In addition, the NVM area is patterned and etched with a second etch mask to remove the dummy poly select gates and any underlying gate dielectric layer, thereby exposing substrate source regions for implantation.

In this disclosure, an improved system, apparatus, and fabrication method are described for fabricating embedded non-volatile memory devices on-chip with CMOS metal-gate transistors using patterned dummy features (e.g., patterned poly layers or oxide layers) to form inlaid control gates, dummy control gates, and strap cell or end cap contact regions that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. With some existing HKMG fabrication processes, there are challenges with integrating a split-gate TFS bitcell into a gate last technology that is used to form the HKMG electrodes. For example, in a gate-last process where wafer planarization is applied to expose transistors formed using a sacrificial polysilicon gate to implement an inlaid or damascene method of forming HKMG gates, non-volatile memory designs which use a double-high gate stack in the split-gate NVM bitcell (e.g., due to overlap of the control gate on part of the select gate transistor) would be destroyed during the wafer planarization step. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a first example semiconductor device or structure 10 formed on a substrate 101. Though the various structures, well, and layer regions are illustrated herein are shown simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

In the semiconductor structure 10, the depicted substrate 101 may be formed as a bulk semiconductor substrate or other substrate in which one or more additional semiconductor layers and/or well regions are formed using epitaxial semiconductor growth and/or selective doping techniques as described more fully hereinbelow. For example, the substrate 101 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 101 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof.

Though not shown, it will be appreciated that shallow trench isolation (STI) regions may be formed in an upper portion of the substrate 101 to defined separate substrate regions, such as a flash memory cell area and a CMOS device region, using any desired STI fabrication technique. In addition, active substrate layers (not shown) may also be formed in upper portions of substrate 101 between the STI regions to have predetermined doping concentrations and profiles, depending on whether the devices formed in each area are n-type or p-type devices.

On the semiconductor structure 10, a plurality of patterned select gate layers may be formed using any desired processing steps. By way of providing a non-limiting example of processing steps that may be used, one or more gate dielectric layers 102 may be formed over the entirety of the substrate 101, such as by growing or depositing a base dielectric layer of silicon dioxide or other suitable gate dielectric material to a predetermined gate dielectric thickness. For example, a base dielectric layer may be selectively formed on the wafer substrate 101 by thermally growing an oxide layer and/or depositing an oxide with a low pressure chemical vapor deposition (LPCVD) high temperature oxide (HTO) to a predetermined thickness (e.g., approximately 5-50 Angstroms), though other materials or thicknesses may be used. After forming the base dielectric layer, a high-k dielectric layer may be formed to a predetermined gate dielectric thickness over the semiconductor structure 20, alone or in combination with a deposited barrier metal layer. In selected embodiments, the high-k dielectric layer may be formed by depositing a high-k gate dielectric material with a relatively high dielectric constant value on top of the base dielectric layer using chemical vapor deposition (CVD), plasma-enhanced chemical vapor deposition (PECVD), physical vapor deposition (PVD), atomic layer deposition (ALD), or any combination(s) of the above. In selected embodiments, the high-k dielectric layer may be formed by a low temperature CVD or ALD process to a predetermined final thickness in the range of 1-100 Angstroms (e.g., 15-25 Angstroms), though other thicknesses may be used. A suitable high-k gate dielectric material for the high-k dielectric layer is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, ScSiO$_X$, CeSiO$_X$, and HfLaSiO$_X$. In addition, multi-metallic oxides (for example barium strontium titanate, BST) may also provide high-k dielectric properties. A suitable temperature for the deposition process is in the range of approximately 200 degrees Celsius to approximately 400 degrees Celsius.

On the gate dielectric layer(s) 102, one of more patterned select gate and dummy gate conductor layers 110-114 may be formed, such as by blanket-depositing a layer of barrier metal to a thickness of approximately 50-200 Angstroms followed by a layer of polysilicon or SiGe over the gate dielectric layer(s) 102 by using CVD, PECVD, PVD, ALD, or any combination(s) thereof to a thickness of approximately 500-2000 Angstroms, though thinner or thicker layers may also be used. The select gate conductor layers may be deposited as a doped poly layer, or may be subsequently doped with appropriate impurities to make the select gate layer conductive. If desired, a gate cap layer 115 may be formed to cover the conductive select gate layer(s) 110-114, such as by depositing an oxide/nitride layer stack, or any other preferred combination of protect layers. By forming the gate cap layer 115 with a top surface layer of nitride, it will not grow oxide during subsequent oxidation steps. The gate cap layer 115, conductive select gate layer(s) 110-114, and underlying gate dielectric layers 102 may be patterned and anisotropically etched to form the select gate electrode stacks 117 and dummy select gate electrode stacks 118 and to expose at least the control gate channel areas 103 in the wafer substrate 101. In selected embodiments, the dummy select gate electrode stack 118 may be patterned to a larger width than the normal select gate electrode stacks 117 (e.g., approximately twice as wide) to leave space for a subsequently-formed contact and contact-gate structure. As will be appreciated, any desired gate patterning and etch sequence may be used to form the patterned select and dummy gate electrode stacks 117, 118, including but not limited to forming a first patterned photoresist layer or hard mask 116, TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the select gate pattern etch sequence, the exposed gate dielectric layer(s) 102 may also be cleared from the surface of the substrate 101.

As described more fully hereinbelow, the shape and position of the patterned select gate electrode stacks 117 are controlled to form an array of parallel select gate electrodes which have a minimum specified select gate width and which are spaced apart from one another by a first minimum specified distance. In addition, the shape and position of the patterned dummy gate electrode stacks 118 are controlled to form one or more dummy structures over at least the intended source regions and which are spaced apart from a corresponding patterned gate electrode stack 117 by a minimum specified control gate width or distance, thereby defining a gap between the dummy gate electrode stacks 118 and corresponding patterned gate electrode stack 117 within which the inlaid control gates will subsequently be formed. The shape and position of the patterned dummy gate electrode stacks 118 may also be controlled to form one or more additional dummy structures which are spaced apart from the patterned select and dummy gate electrode stacks 117, 118 by a minimum specified contact area distance, thereby defining a gap within which the inlaid strapped or end cell contacts will subsequently be formed.

Figure 2:
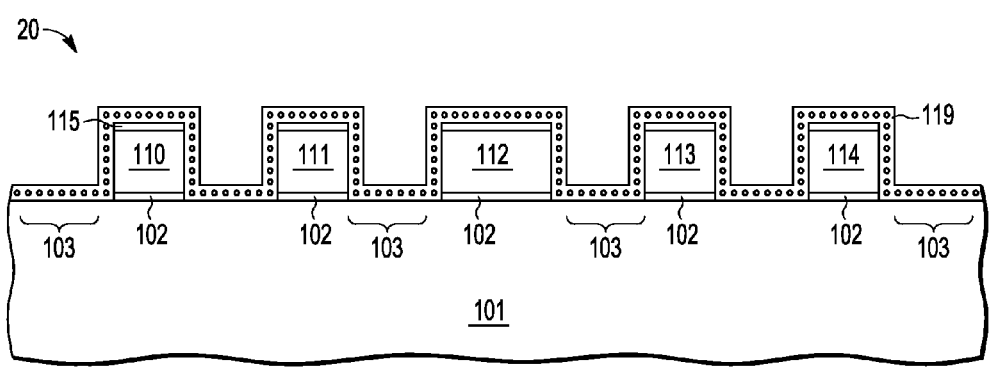

FIG. 2 illustrates processing of the semiconductor structure 20 subsequent to FIG. 1 after a charge storage layer 119 is formed over at least the patterned select and dummy gate electrode stacks 117, 118. As an initial step, any etch mask or photoresist layers 116 are stripped or removed from the patterned select and dummy gate electrode stacks 117, 118 to expose the control gate channel areas 103 in the wafer substrate 101 where one or more counter-doped control gate channel regions (not shown) may be formed by implanting impurities around the patterned select and dummy gate electrode stacks 117, 118 and any implant masks using conventional implanting processes to implant ions having a predetermined conductivity type. Subsequently, a charge storage layer 119 may be formed over the semiconductor structure 20, including the top and side surface of the patterned select and dummy gate electrode stacks 117, 118 and the control gate channel regions 103. While any desired charge storage layer sequence may be used, in selected example embodiments, the charge storage layer 119 may be formed by forming an insulating layer over the substrate 101 and patterned select and dummy gate electrode stacks 117, 118, such as by growing an oxide or by depositing a high-k dielectric layer or other appropriate insulating layer to a predetermined thickness (e.g., approximately 40-150 Angstroms), though other thicknesses may be used. On the insulating layer, a layer of conductive nanocrystals may be formed, where the nanocrystals having predetermined diameters (e.g., approximately 3-10 nanometers) and spacing (e.g., about 5 nanometers apart). After depositing the nanocrystals, an insulating layer is formed over and around the nanocrystals, such as by depositing an oxide or a suitable high-k dielectric with a low pressure chemical vapor deposition (LPCVD) to a predetermined thickness (e.g., approximately 100-200 Angstroms), though other materials or thicknesses may be used. Again, the relative thicknesses of the different layers (e.g., 102, 119) have not necessarily been drawn to scale for purposes of simplicity and clarity of illustration.

Figure 3:
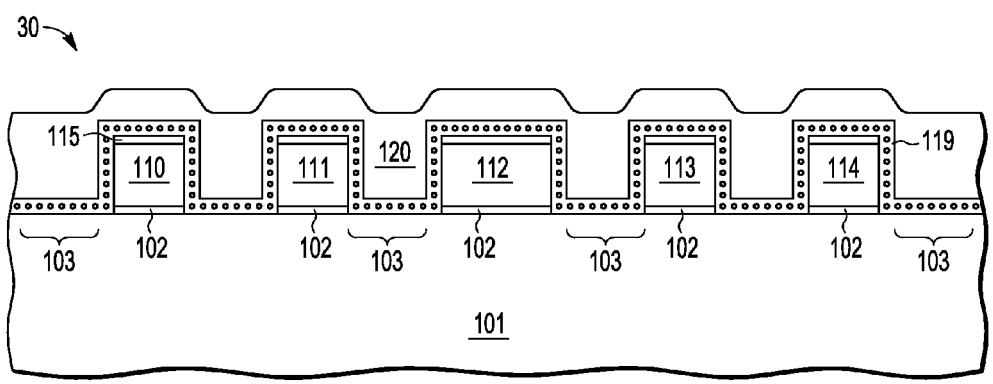

FIG. 3 illustrates processing of the semiconductor structure 30 subsequent to FIG. 2 after forming a control gate poly layer 120 on the charge storage layer 119, alone or in combination with a control gate barrier metal layer, to cover at least the patterned select and dummy gate electrode stacks 117, 118. As a preliminary step, a control gate barrier metal layer (not shown) may be deposited on the charge storage layer 119, such as by depositing titanium nitride using CVD, PECVD, PVD, ALD, or any combination(s) thereof to a predetermined thickness of approximately 50-150 Angstroms, though other materials or thicknesses may be used. In addition or in the alternative, a control gate layer 120 may be formed on the semiconductor structure 20, such as by blanket-depositing a layer of polysilicon or SiGe using CVD, PECVD, PVD, ALD, or any combination(s) thereof to a thickness of approximately 500-2000 Angstroms, though a thinner or thicker layer may also be used. When formed as a control gate poly layer 120, the thickness of the control gate poly layer 120 (alone or in combination with the control gate barrier metal layer) is sufficient to completely fill the openings formed between the patterned select and dummy gate electrode stacks 117, 118. The control gate layer 120 may be deposited as a doped poly layer, or may be subsequently doped with appropriate impurities to make the control gate layer 120 conductive.

Figure 4:
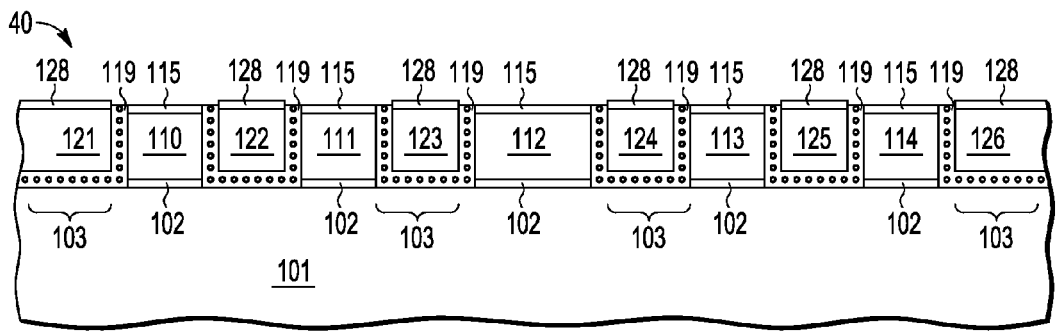

FIG. 4 illustrates processing of the semiconductor structure 40 subsequent to FIG. 3 after dielectric cap layers 128 are formed on inlaid control gate structures 121-126. In selected embodiments, the inlaid control gate structures 121-126 may be formed by applying a planarization step (e.g., a chemical mechanical polish step) to the control gate layer 120 to form polished control gate structures (not shown) having top surfaces that are substantially co-planar with the top of the conductive select gate layer(s) 110-114 or even lower, depending on the extent of the planarization step. In addition or in the alternative, one or more etch processes may be applied to the control gate layer 120 to form the inlaid control gate structures 121-126. As formed, the inlaid control gate structures 121-126 include one or more inlaid control gates 121, 123, 124, 126 and associated charge storage layers 119 formed over the intended control gate channel regions 103 and bounded by patterned select and/or dummy gates, so that each inlaid control gate (e.g., 123) is positioned adjacent to a corresponding select gate electrode (e.g., 111) to form a split-gate NVM bitcell. In addition, the inlaid control gate structures 121-126 include one or more inlaid dummy or parasitic control gates 122, 125 and associated charge storage layers 119 formed over the intended drain regions and bounded by patterned select gates, so that each inlaid dummy or parasitic control gate (e.g., 122) is positioned between adjacent select gate electrode stacks (e.g., 110, 111). Finally and as illustrated below in FIGS. 7-8, the inlaid control gate structures 121-126 may include one or more inlaid strapped or end cell contact regions which are formed over the intended control gate electrode contact regions and bounded by patterned dummy select gates, each of which is physically continuous with and electrically connected to an inlaid control gate.

On the exposed upper surfaces of the inlaid control gate structures 121-126, the dielectric cap layers 128 may be selectively formed, such as by thermally growing an oxide layer 128 to a predetermined thickness of 100-400 Angstroms, though other materials or thicknesses may be used. Because nitride does not readily oxidize, the patterned select and dummy gate electrode stacks 117, 118 are all protected by a dielectric nitride cap layer 115 during subsequent etch processing.

Figure 5:
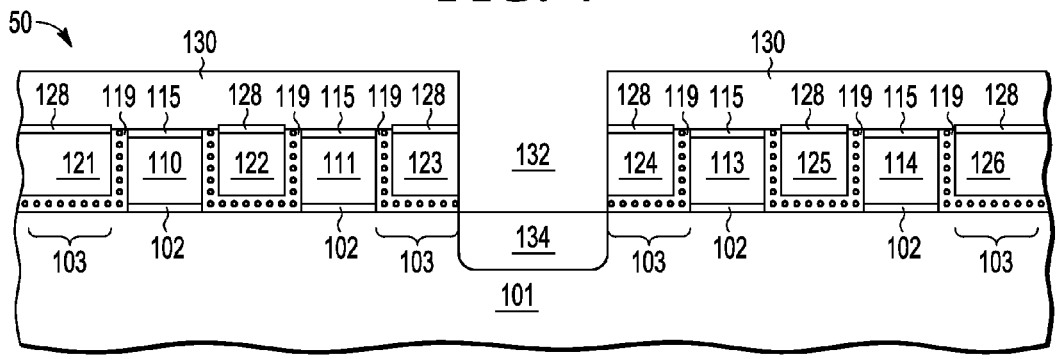

FIG. 5 illustrates processing of the semiconductor structure 50 subsequent to FIG. 4 after removing the dummy select gate electrode stacks 102, 112, 115 to expose and implant a source region 134. As will be appreciated, any desired selective etch sequence may be used to remove the dummy select gate electrode stacks 118, including but not limited to forming a second patterned photoresist layer or hard mask 130 and applying one or more etch processes. For example, a second patterned photoresist layer and/or hard mask 130 may be formed by sequentially depositing a nitride layer, TEOS layer, and photoresist layer over the entire surface of the semiconductor structure 60. After developing the photoresist layer and etching the exposed hard mask 130 to define pattern openings therein, the exposed portions of the unmasked gate cap layer 115, patterned poly layers in the dummy select gate 112, and charge storage layer 119 may be removed using any desired etch process, including a dry etching process such as reactive-ion etching, ion beam etching, plasma etching or laser etching, a wet etching process wherein a chemical etchant is employed, or any combination thereof. For example, a TEOS etch may be applied (using the photoresist as a mask), followed by a nitride etch (using the remnant TEOS as a mask), pre-etch cleaning, main poly plasma etch, soft landing etch, poly clean overetch, oxide break through etch to remove the gate dielectric layer(s) 102, wet etch to remove the charge storage layer 119 and post-etch cleaning. As a result, an opening 132 is formed down to the substrate 101 by anisotropically etching the unmasked gate cap layer 115, dummy select gate 112, gate dielectric layer(s) 102 (along with any exposed sidewall portions of the charge storage layer 119 and inlaid control gates 123, 124) using any desired etch sequence, including but not limited to patterned photoresist in combination with one or more anisotropic etch processes. In selected embodiments, the thermal oxide layer 128 protects the neighboring control gates 123, 124 during the removal of the dummy select gate electrode stacks 118, allowing for patterning of mask 130 to land atop neighboring control gates 123, 124. In this way, critical alignment is not required of mask 130. By properly patterning the dummy select gate electrode stacks 118 used to define the gate edge of the inlaid control gates 123, 124 and inlaid strapped or end cell contact regions, and then selectively removing the dummy select gate electrode stacks 118, the line width and gate edge of the inlaid control gates 123, 124 and inlaid strapped or end cell contact regions can be exactly defined and well controlled. As will be appreciated, the alignment is not critical for patterning of opening 132, as the oxide protection cap on the neighboring CG 123, 124 will not be etched.

After stripping or removing the patterned photoresist layer from the patterned photoresist layer or hard mask 130, the shared source region 134 may be formed, such as by using one or more patterned implant masks (not shown) to implant appropriate polarity dopants into the exposed substrate 101, such as n-type source regions 134 for n-type NVM bitcells or p-type source regions 134 for p-type NVM bitcells.

Figure 6:
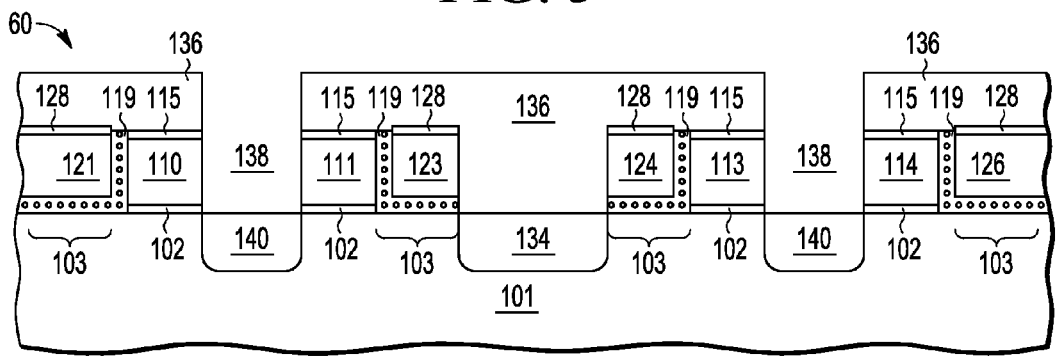

FIG. 6 illustrates processing of the semiconductor structure 60 subsequent to FIG. 5 after removing the dummy control gate electrode stacks 122, 125 and underlying charge storage layers 119 to expose and implant drain regions 140. As will be appreciated, any desired selective etch sequence may be used to remove the dummy control gate electrode stacks 122, 125, including but not limited to forming a third patterned photoresist layer or hard mask 136. For example, a third patterned photoresist layer 136 may be formed by patterning a photoresist layer over the entire surface of the semiconductor structure 70. After developing the photoresist layer to define pattern openings therein, the exposed portions of the unmasked dielectric cap layer 128, patterned poly layers in the dummy control gates 110, 114, and charge storage layer 119 may be removed using any desired etch process, including a dry etching process such as reactive-ion etching, ion beam etching, plasma etching or laser etching, a wet etching process wherein a chemical etchant is employed, or any combination thereof. For example, a photoresist layer may be formed over the entire surface of the semiconductor structure 60, which includes the previously deposited nitride and TEOS layer, and then patterned and anisotropically etched with one or more anisotropic etch processes to define patterned openings 138 which expose the substrate 101 over the intended drain regions. In particular, the openings 138 are formed down to the substrate 101 by anisotropically etching the unmasked dielectric cap layer 128, dummy control gate 122, 125, and underlying gate dielectric layer(s) 102 (along with any exposed sidewall portions of the charge storage layer 119 and patterned select gates 110/111, 113/114) using any desired etch sequence, including but not limited to patterned photoresist in combination with one or more anisotropic etch processes. In selected embodiments, the nitride layer 115 protects the neighboring select gates 110/111, 113/114 during the removal of the dummy control gates 122, 125, allowing for patterning of mask 136 to land atop neighboring select gates 110/111, 113/114. In this way, critical alignment is not required of mask 136. By properly patterning the openings 138 in the third patterned photoresist layer or hard mask 136, parasitic control gate elements (e.g., 122) are removed so that each split-gate NVM bitcell (e.g., 41) has only a single inlaid control gate (e.g., 123) formed adjacent to the patterned select gate (e.g., 111).

After stripping or removing the patterned photoresist layer from the patterned photoresist layer or hard mask 136, the drain regions 140 for each split-gate NVM bitcell 141, 142 may be formed, such as by using one or more patterned implant masks (not shown) to implant appropriate polarity dopants into the exposed substrate 101, such as n-type source regions 140 for n-type NVM bitcells or p-type source regions 140 for p-type NVM bitcells.

While the depicted fabrication sequence for forming the first example semiconductor device shown in FIGS. 5-6 show that the dummy select gate electrode stacks are removed prior to removing the dummy control gate electrode stacks, it will be appreciated that the fabrication sequence can be changed if desired to remove the dummy control gate electrode stacks prior to removing the dummy select gate electrode stacks.

Figure 7:
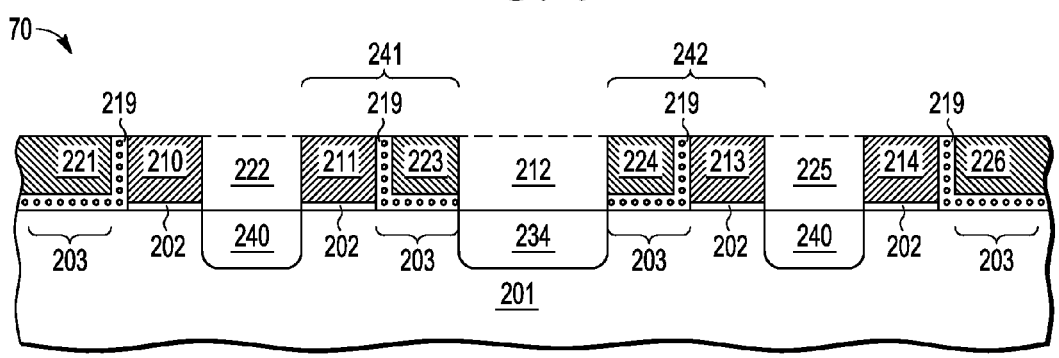
FIGS. 7-9 show cross-section and plan views at different stages of fabricating split-gate thin film storage non-volatile memory bitcells with inlaid control gates having strap end control gate contacts.
Figure 8:
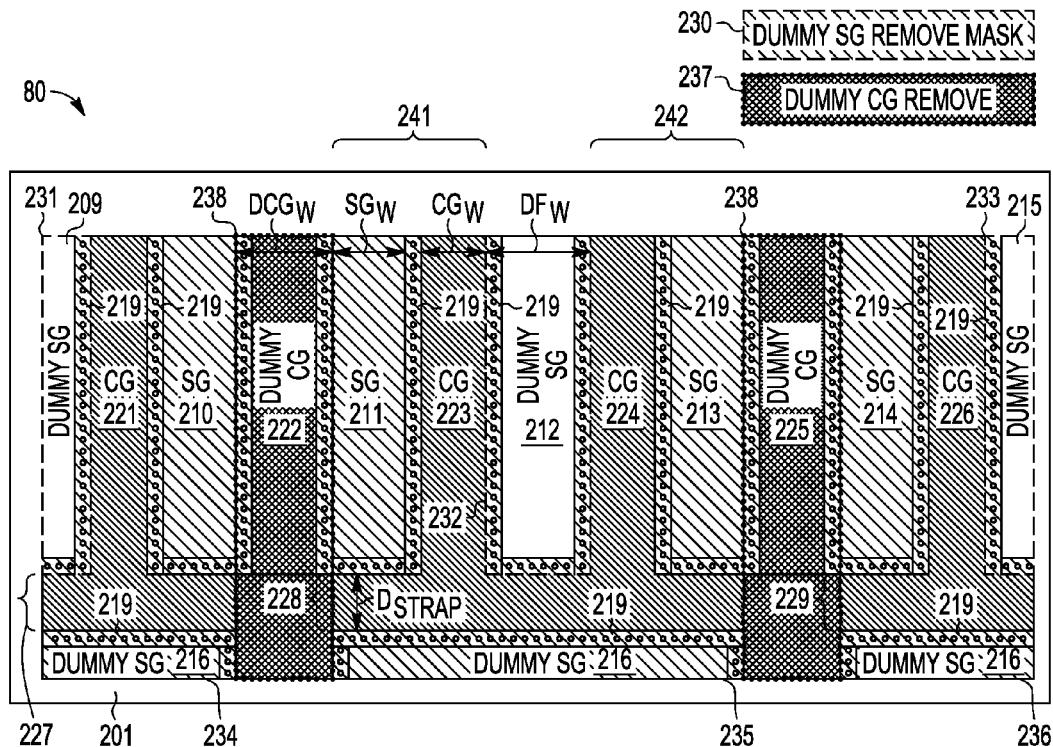
Figure 9:
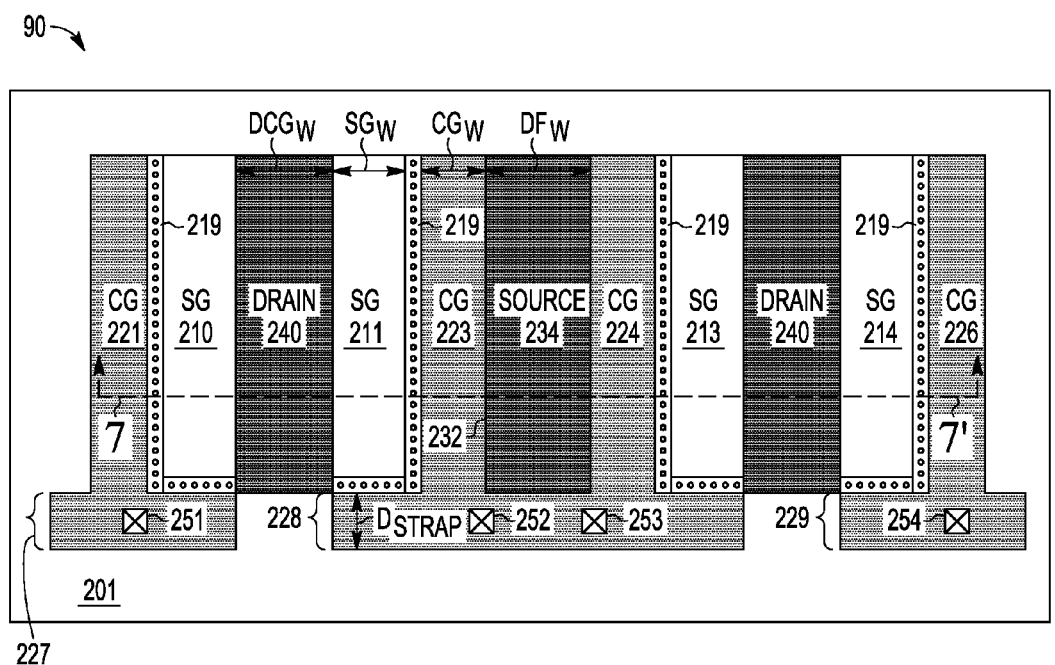

FIGS. 7-9 show cross-sectional and plan views 70, 80, 90 of a semiconductor structure at different stages of fabricating an array of split-gate thin film storage non-volatile memory bitcells 241, 242 with one or more inlaid control gates (e.g., 223, 224) and inlaid strap end control gate contact regions (e.g., 228) which are continuously formed as a single word line. As illustrated in the cross-sectional view 70 of FIG. 7 and plan view 90 of FIG. 9, columns of select gate electrodes 210, 211, 213, 214 are interlaced with corresponding columns of inlaid control gate electrodes 221, 223, 224, 226 to form an array of split-gate thin film storage non-volatile memory bitcells in regions where the gates cross active lines (not shown) formed in the substrate 201. Though not shown, it will be appreciated that the active lines form source/channel/drain of each bitcell, and may be formed as silicon substrate lines that are delineated from one another by forming shallow trench isolation (STI) regions between each active line. As illustrated in the cross-sectional view 70 of FIG. 7 and plan view 80 of FIG. 8, the columns of inlaid control gate electrodes 221, 223, 224, 226 are formed by interlacing parallel columns of patterned select gate electrodes 210, 211, 213, 214 having a specified select gate width ($SG_W$) with parallel columns of patterned dummy template features 209, 212, 215 (e.g., patterned parallel columns of dummy select gate electrodes covered by charge storage layers) having a specified dummy feature width ($DF_W$) so as to be spaced apart from one another by a gap. (In FIG. 7, the patterned dummy template features 212 are shown with dashed lines to indicate their subsequent removal during formation of the source region(s) 234 as shown in FIG. 9.) In each gap, a charge storage layer 219 is formed on the sidewalls of the patterned select gate electrodes 210, 211, 213, 214 and dummy template features 209, 212, 215 to cover the bottom and sidewall surfaces of the gap, and a control gate layer is deposited and planarized to form inlaid dummy control gate electrodes (e.g., 222, 225) and inlaid control gate electrodes (e.g., 223) having a specified control gate width ($CG_W$). (In FIG. 7, the patterned dummy template features 222, 225 are shown with dashed lines to indicate their subsequent removal during formation of the drain regions 240 as shown in FIG. 9.) As formed, the inlaid control gate electrodes 221, 223, 224, 226 and associated charge storage layers 219 are formed over the intended control gate channel regions 203 and bounded by patterned select and/or dummy gates 209, 212, 215, so that each inlaid control gate (e.g., 223) is positioned adjacent to a corresponding select gate electrode (e.g., 211) to form a split-gate NVM bitcell.

In order to form electrical contacts to the inlaid control gate electrodes 221, 223, 224, 226, one or more inlaid strap end control gate contact regions 227-229 may be formed at each peripheral end of the inlaid control gate columns 221, 223, 224, 226. During formation of the patterned select gate electrodes 210, 211, 213, 214 and dummy template features 209, 212, 215, the inlaid strap end control gate contact regions 227-229 may be formed by patterning or otherwise forming one or more additional dummy template features 216 (e.g., a patterned row of dummy select gate electrodes covered by charge storage layers) at a peripheral end of the array of split-gate thin film storage non-volatile memory bitcells so as to be spaced apart from the peripheral end of the select gate electrode columns 210, 211, 213, 214 by a strap gap having a specified strap distance ($D_{STRAP}$). In the strap gap, the control gate layer is deposited and planarized (alone or in combination with an underlying a charge storage layer) to form one or more inlaid strap end control gate contact regions 227-229.

Once the control gate layer is deposited and planarized (e.g., with a chemical mechanical polish process), the parallel columns of patterned dummy template features 209, 212, 215 and any adjacent charge storage layers 219 may be selectively removed with one more first patterned etch processes. The additional dummy template features 216 and adjacent charge storage layers 219 may also be removed if desired. For purposes of illustration, FIG. 8 shows a first etch mask 230 indicated with diagonal shading lines having defined etch openings 231-233 which are positioned to expose the patterned dummy template features 209, 212, 215. Thus exposed, the patterned dummy template features 209, 212, 215 may be removed by applying one or more etch processes (e.g., a poly etch process, alone or in combination with one or more charge storage layer etch processes) to expose the intended source regions 234 of the substrate 201 while protecting the inlaid control gates 221, 223, 224, 226 and inlaid strap end control gate contact regions 227-229. At this point, the exposed regions of the substrate may be implanted with one or more implantation steps to form the source regions (e.g., 234). While FIG. 8 shows the defined etch openings 231-233 as exposing the patterned dummy template features 209, 212, 215 but not the adjacent charge storage layer 219, it is noted that the actual mask pattern openings may be sized larger to land on the neighboring control gate region, since the oxide or other dielectric protect layer (e.g., 128 in FIG. 5) will prevent etching of the inlaid control gates 221, 223, 224, 226 and inlaid strap end control gate regions 227-229.

Before or after removing the dummy template features 209, 212, 215, the inlaid dummy control gate electrodes (e.g., 222, 225) may be selectively removed with one or more second patterned etch processes. For purposes of illustration, FIG. 8 shows a second etch mask 237 with defined etch openings 238 indicated with cross-hatched shading which are positioned to expose the inlaid dummy control gate electrodes 222, 225 and adjacent charge storage layers 219. Thus exposed, the inlaid dummy control gate electrodes 222, 225 and adjacent charge storage layers 219 may be removed by applying one or more etch processes (e.g., a poly etch process, alone or in combination with one or more charge storage layer etch processes) to expose the intended drain regions 240 of the substrate 201 while protecting the inlaid control gates 221, 223, 224, 226 and inlaid strap end control gate contact regions 227-229. At this point, the exposed regions of the substrate may be implanted with one or more implantation steps to form the drain regions (e.g., 240). While FIG. 8 shows the defined etch openings 238, the actual mask pattern may be sized larger to land on the neighboring select gate region, since the nitride or other dielectric protect layer (e.g., 115 in FIG. 6) will prevent etching of the select gates.

FIG. 9 is a plan view 90 of the semiconductor structure 70 shown in cross-section in FIG. 7 (along view lines 7-7') to illustrate processing subsequent to FIG. 8 after selectively removing the dummy features 209, 212, 215-216, 222, and 225 (along with any desired adjacent charge storage layers 219) and implanting the source and drain regions 234, 240, thereby forming the array of split-gate thin film storage nonvolatile memory bitcells 241, 242 with one or more inlaid control gates (e.g., 223, 224) and inlaid strap end control gate contact regions (e.g., 228) which are continuously formed as a single word line. On each inlaid strap end control gate contact region 227-229, one or more electrical contacts 251-254 may be formed using any desired contact formation sequence to supply the desired voltages to the various rows of inlaid control gates 221, 223, 224, 226. For example, each electrical contact 251-254 may be formed as a metal via that is positioned near a center line of the inlaid strap end control gate contact region 227-229 and extends through one or more dielectric layers to make electrical contact with an overlying metal line (not shown) which carries the word line voltage or signal. In this configuration, multiple columns of inlaid control gates can be controlled by a single word line voltage that is applied to a shared inlaid strap end control gate contact region (e.g., during block erase operations) which is continuously formed as a single word line with the multiple columns of inlaid control gates. As shown, a first split-gate electrode column 221, 219, 210 includes an inlaid strap end control gate contact region 227 that is physically continuous with the control gate electrode 221 and electrically connected through the first contact via 251 to a first word line voltage. In addition, a second split-gate electrode column 211, 219, 223 and third split-gate electrode column 224, 219, 213 are connected with an inlaid strap end control gate contact region 228 that is physically continuous with the control gate electrodes 223, 224 and electrically connected through the contact via(s) 252, 253 to one or more second word line voltages. There is also a fourth split-gate electrode column 214, 219, 226 connected with an inlaid strap end control gate contact region 229 that is physically continuous with the control gate electrode 226 and electrically connected through the contact via 254 to a third word line voltage.

As will be appreciated, additional processing steps may be used to complete the fabrication of the split-gate nonvolatile memory cells. In addition to various front end processing steps (such as sacrificial oxide formation, stripping, isolation region formation, gate electrode formation, extension implant, halo implant, spacer formation, source/drain implant, annealing, silicide formation, and polishing steps), additional processing steps may be used to form high-k metal gate electrodes for use in the array of split-gate thin film storage non-volatile memory bitcells and/or any integrated NMOS or PMOS logic transistors. For example, high-k metal gate electrodes may be formed by forming silicide layers or regions on a poly gate electrode (including but not limited to a select gate electrode and/or inlaid control gate electrode), or by using a gate-last method to replace a poly gate electrode (including but not limited to a select gate electrode and/or inlaid control gate electrode) with a metal gate electrode. In addition, backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 10:
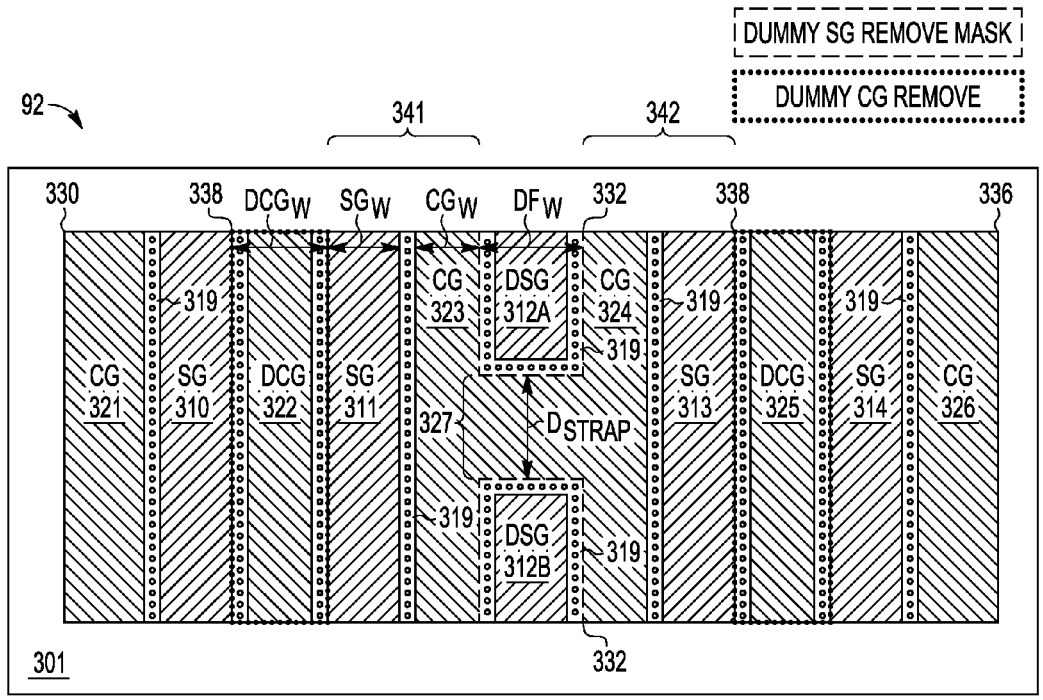
FIGS. 10-11 show plan views at different stages of fabricating split-gate thin film storage non-volatile memory bitcells with inlaid control gates having in-cell control gate contacts.

While the fabrication of inlaid control gate contact regions is described hereinabove with reference to inlaid strap end control gate contact regions which may be located at a peripheral end of the TFS NVM array, it will be appreciated that various benefits of the present disclosure may also be obtained from forming inlaid control gate contact regions along other locations in the TFS NVM array. For example, FIG. 10 shows a plan view 92 of a semiconductor structure including an array of split-gate thin film storage non-volatile memory bitcells 341, 342 with one or more inlaid control gates (e.g., 323, 324) and an inlaid control gate contact region 327 formed along one or more interior positions of the TFS NVM array using patterned dummy template features 312A, 312B. As illustrated, columns of select gate electrodes 310, 311, 313, 314 are interlaced with corresponding columns of inlaid control gate electrodes 321, 323, 324, 326 to form an array of split-gate thin film storage non-volatile memory bitcells. The columns of inlaid control gate electrodes 321, 323, 324, 326 are formed by interlacing parallel columns of patterned select gate electrodes (e.g., 311, 313))—having a specified select gate width ($SG_W$) and separation spacing—with one or more patterned parallel columns of dummy select gate electrodes (e.g., 312A, B) that are separated from one another by spacing gaps, forming a charge storage layer 319 on the sidewalls of the patterned select gate electrodes and dummy select gate electrodes 310-314 to cover the bottom and sidewall surfaces of the spacing gaps, and depositing and planarizing a control gate layer to form inlaid dummy control gate electrodes (e.g., 322, 325) and inlaid control gate electrodes (e.g., 323, 324) having a specified control gate width ($CG_W$). In this way, inlaid control gates 323, 324 having a specified control gate width ($CG_W$) are formed between patterned dummy template features 312, 319 having a specified dummy feature width ($DF_W$), while inlaid dummy template features having a specified dummy feature width ($DCG_W$) are formed between patterned select gates 310, 311 and adjacent charge storage layers 319 to define patterned parallel columns of patterned select gate electrodes and inlaid control gate electrodes spaced apart from one another by dummy select gate electrodes (e.g., 312A, B) that are covered by charge storage layers (e.g., 319).

In order to form electrical contacts to the inlaid control gate electrodes (e.g., 323, 324), one or more inlaid strap control gate contact regions 327 may be formed at an interior position of the TFS NVM array. The inlaid strap control gate contact regions 327 may be formed by patterning or otherwise forming the patterned dummy template feature 312 as a plurality of separate dummy feature segments 312A, 312B with one or more breaks or gaps formed therebetween so as to be spaced apart from one another by a specified strap distance ($D_{STRAP}$). In the strap gap between dummy feature segments 312A, 312B, the deposited and planarized control gate layer (alone or in combination with an underlying a charge storage layer) forms an inlaid strap control gate contact region 327.

Once the control gate layer is deposited and planarized (e.g., with a chemical mechanical polish process), the parallel columns of patterned dummy feature segments 312A, 312B and adjacent charge storage layer 319 may be selectively removed with a first patterned etch process. For purposes of illustration, FIG. 10 shows a first etch mask 330 having defined etch openings 332 indicated with large dashed lines which are positioned to expose the patterned dummy feature segments 312A, 312B. Thus exposed, the patterned dummy feature segments 312A, 312B may be removed by applying one or more etch processes (e.g., a poly etch process, alone or in combination with one or more charge storage layer etch processes) to expose the intended source regions of the substrate 301 while protecting the inlaid control gates 321, 323, 324, 226 and inlaid strap end control gate contact regions 327. At this point, the exposed regions of the substrate 301 may be implanted with one or more implantation steps to form the source regions (e.g., 333, 334).

Before or after removing the patterned dummy feature segments 312A, 312B, the inlaid dummy control gate electrodes (e.g., 322, 325) may be selectively removed with a second patterned etch process. For purposes of illustration, FIG. 10 shows a second etch mask 336 with defined etch openings 338 indicated with small dashed lines which are positioned to expose the inlaid dummy control gate electrodes 322, 325. Thus exposed, the inlaid dummy control gate electrodes 322, 325 may be removed by applying one or more etch processes (e.g., a poly etch process, alone or in combination with one or more charge storage layer etch processes) to expose the intended source regions of the substrate 301 while protecting the inlaid control gates 321, 323, 324, 226 and inlaid strap end control gate contact regions 327. At this point, the exposed regions of the substrate 301 may be implanted with one or more implantation steps to form the drain regions (e.g., 340).

Figure 11:
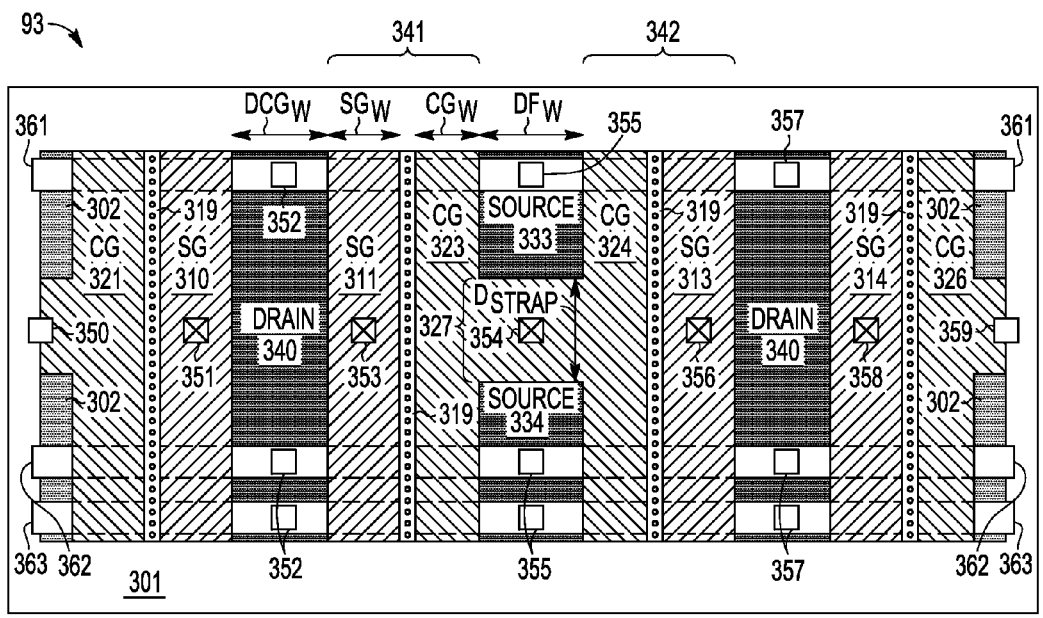

FIG. 11 illustrates processing of the semiconductor structure 93 subsequent to FIG. 10 after selectively removing the dummy features 312A, 312B, 322, 325, and implanting the source and drain regions 333-334, 340, thereby forming the array of split-gate thin film storage non-volatile memory bitcells 341, 342 with one or more inlaid control gates (e.g., 323, 324) connected together with an inlaid strap control gate contact region (e.g., 327) which are continuously formed as a single word line. As illustrated, the removal of the dummy features 312A, 312B, 322, 325 exposes active substrate lines 361-363 formed in the substrate 301 which are located below the poly gate layers used to form the select gate and control gate layers, as indicated by the dashed line portions of the active lines 361-363. In FIG. 11, the outer control gates 321, 326 are shown as being patterned to define source regions 302 similarly to the source regions 333, 334 that are separated by inlaid strap end control gate contact region 327. On each inlaid strap control gate contact region 327, one or more electrical contacts 354 may be formed using any desired contact formation sequence to supply the desired voltages from an overlying metal line (not shown) to the various rows of inlaid control gates 323, 324. For example, each electrical contact 354 may be formed as a metal via that is positioned near a center line of the inlaid strap control gate contact region 327 and extends through one or more dielectric layers to make electrical contact with an overlying metal line (not shown) which carries the word line voltage or signal. Additional electrical contacts 350-353, 355-359 may also be formed to the other source, drain, and gate electrodes as illustrated, including outer control gate contacts 350, 359 for connecting to the outer control gates 321, 326, select gate contacts 351, 353, 356, 358 for connecting to the select gates 310-311, 313-314, drain contacts 352, 357 for connecting to the drains regions in the active lines 361, 362, and source contacts 355 for connecting to the source regions in the active lines 361, 362. In this configuration, multiple columns of inlaid control gates can be formed with well-defined line width and gate edge dimensions and placement, and can be controlled by a single word line voltage that is applied to a shared inlaid strap control gate contact region (e.g., during block erase operations) which is continuously formed as a single word line with the multiple columns of inlaid control gates. As shown in FIG. 11, a first split-gate electrode column 311, 319, 323 and second split-gate electrode column 324, 319, 313 are connected with an inlaid strap control gate contact region 327 that is located at an interior position of the TFS NVM array and is physically continuous with the control gate electrodes 323, 324 and electrically connected through the contact via(s) 354 to one or more word line voltages.

As seen from above, the split-gate TFS NVM bitcells with inlaid control gates and strapped control gate contact regions and associated fabrication process are disclosed with reference to using a patterned dummy select gate electrode template structure to separately delineate and form a pair of inlaid control gate electrodes adjacent to a corresponding pair of patterned select gate electrodes. However, it will be appreciated that various benefits of the present disclosure may also be obtained by forming other dummy template features when separately delineating and forming inlaid control gate electrodes. For example, FIGS. 12-17 show a second example semiconductor device during successive phases of a fabrication sequence for forming split-gate thin film storage non-volatile memory bitcells by etching openings in a planarized oxide layer to form patterned dummy oxide template features to separately delineate and form a pair of inlaid control gate electrodes adjacent to a corresponding pair of patterned select gate electrodes.

Figure 12:
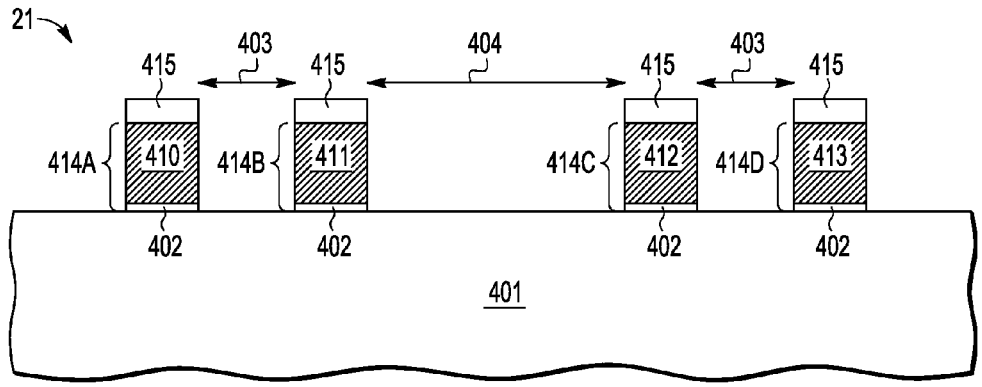
FIGS. 12-17 show a second example semiconductor device during successive phases of a fabrication sequence for forming split-gate thin film storage non-volatile memory bitcells with inlaid control gates.

Starting with FIG. 12, there is shown a partial cross-sectional view of the second semiconductor device or structure 21 formed on a substrate 401. The depicted substrate 401 may be formed as a bulk semiconductor substrate formed with any semiconductor material (e.g., Si, SiC, SiGe, SiGeC, Ge, GaAs, InAs, InP, as well as other III/V or II/VI compound semiconductors or any combination thereof), a semiconductor-on-insulator (SOI) type substrate, or any desired substrate structure in which one or more semiconductor layers and/or well regions are formed. Though not shown, shallow trench isolation (STI) structures and active substrate layers of appropriate polarity may be formed in an upper portion of the substrate 401 using any desire technique. In a non-volatile memory array region of the semiconductor structure 21, one or more split-gate polysilicon nanocrystal TFS NVM bitcell structures may be formed with inlaid control gates and strapped interior or end cell control gate contact regions using any desired processing steps. By way of providing a non-limiting example of processing steps that may be used, FIG. 12 shows that a plurality of patterned select gate electrodes 414 may be formed using any desired processing steps. In an example fabrication sequence, the patterned select gate electrodes 414 may be formed by sequentially growing or depositing one or more gate dielectric layers 402 (e.g., silicon dioxide, such as LPCVD HTO, and/or a high-k gate dielectric layer) and then depositing one of more select gate conductor layers 410-13 (e.g., a doped poly layer) using CVD, PECVD, PVD, ALD, or any combination(s) thereof to define a select gate electrode stack. In selected embodiments, a gate cap dielectric layer (not shown) may also be formed on top of the select gate electrode stack. Subsequently, the select gate electrode stack gate may be patterned and selectively etched to form the select gate electrode stacks 414. As will be appreciated, any desired gate patterning and etch sequence may be used to form the patterned select and dummy gate electrode stacks 414, including but not limited to forming a first patterned photoresist layer and/or hard mask 415, which is then used to apply one or more anisotropic etch processes, such as TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the select gate pattern etch sequence, the exposed gate dielectric layer(s) 402 may also be cleared from the surface of the substrate 401.

In contrast to the embodiments described hereinabove, the patterned select gate electrode stacks 414 do not include any patterned dummy select gate electrode stacks. Instead, the shape and position of the patterned select gate electrode stacks 414 are controlled to form an array of parallel select gate electrodes with specified spacing distances or gaps formed between the patterned select gate electrode stacks 414. For example, selected pairs of adjacent patterned dummy select gate electrode stacks (e.g., 414A/B or 414C/D) are spaced apart from one another by a first gap distance 403 defining a drain width dimension, while adjacent pairs of patterned dummy select gate electrode stacks (e.g., 414A/B and 414C/D) are spaced apart from one another by a second gap distance 404 defining a minimum select gate separation width dimension in which a pair of inlaid control gates may subsequently be formed.

Figure 13:
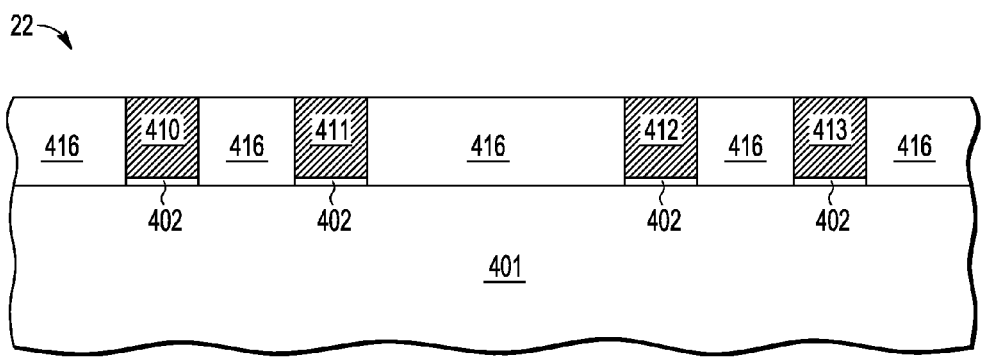

FIG. 13 illustrates processing of the semiconductor structure 22 subsequent to FIG. 12 after a planarized dielectric layer 416 is formed over the patterned select gate electrode stacks 414 to expose at least a top surface of the patterned select gate electrode stacks 414. As an initial step, any etch mask or photoresist layers 415 may be stripped or removed from the patterned select gate electrode stacks 414. Subsequently, the planarized dielectric layer 416 may be formed by depositing one or more planarized dielectric layers 416 over the semiconductor structure 22 as a part of a first interlayer dielectric stack, such as by depositing an oxide layer using CVD, PECVD, PVD, or ALD to a predetermined thickness (e.g., approximately 500-5000 Angstroms) that is at least as thick as the height of the patterned select gate electrode stacks 414. As deposited, the dielectric layer 416 can be formed alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). In addition, the deposited dielectric layer 416 can be planarized using any desired planarization process, such as a timed chemical mechanical polish step, to form a substantially planar surface on the planarized dielectric layer 416 that exposes the top of the patterned select gate electrode stacks 414. As will be appreciated, the planarized dielectric layers 416 may be densified with one or more anneal process steps, though it will be appreciated that an anneal process may also be applied subsequently in the fabrication process.

Figure 14:
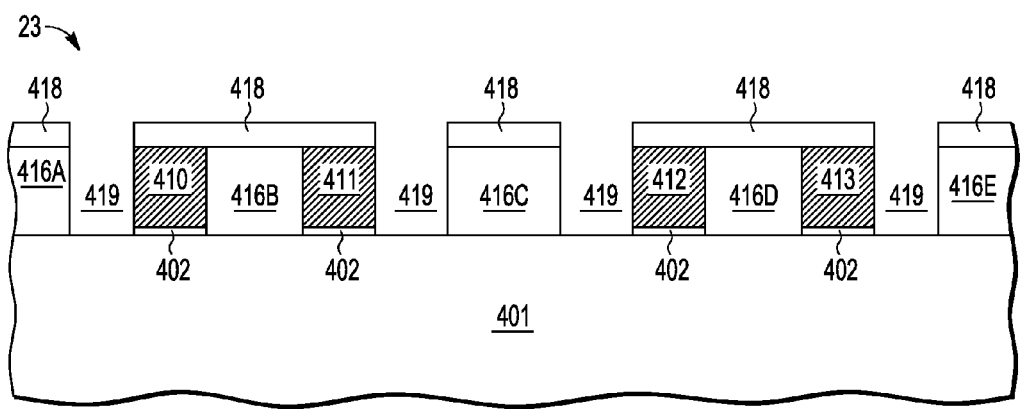

FIG. 14 illustrates processing of the semiconductor structure 23 subsequent to FIG. 13 after the planarized dielectric layer 416 is patterned and etched to form a plurality of control gate openings 419 which define one or more patterned dielectric features 416A-416E, including patterned dielectric template features 416A, 416C, 416E and select gate separation features 416B, 416D. As will be appreciated, any desired dielectric patterning and etch sequence may be used to form the patterned dielectric features 416A-416E. For example, when etching a planarized oxide layer 416, a patterned photoresist layer and/or hard mask 418 may be formed with a patterned nitride layer 418 which protects the patterned select gate electrode stacks 414 and select gate separation features 416B, 416D, but otherwise exposes the planarized dielectric layer 416 over the control gate channel regions. With the patterned photoresist/hard mask 418 in place, the exposed portions of the planarized dielectric layer 416 are selectively etched with a dry etch or wet etch process to form control gate openings 419 between the patterned dielectric features 416A-416E. As a result of the selective etch process, the patterned dielectric features 416A-416E include select gate separation features 416B, 416D formed over the intended drain regions and bounded by patterned select gate electrode stacks (e.g., 414A, 414B). In addition, the patterned dielectric features 416A-416E include patterned dielectric template features 416A, 416C, 416E which are positioned between and spaced apart from a pair of patterned select gate electrode stacks (e.g., 414B, 414C) by a minimum specified control gate width or distance, thereby defining a gap between the patterned dielectric template features (e.g., 416C) and the pair of patterned select gate electrode stacks (e.g., 414B, 414C) within which the inlaid control gates will subsequently be formed. As described hereinabove, the shape and position of the patterned dielectric template features may also be controlled to form one or more additional dummy dielectric template features which are spaced apart from the patterned select gate electrode stacks 414 by a minimum specified contact area distance, thereby defining a gap within which an inlaid strap control gate contact region is subsequently be formed.

Figure 15:
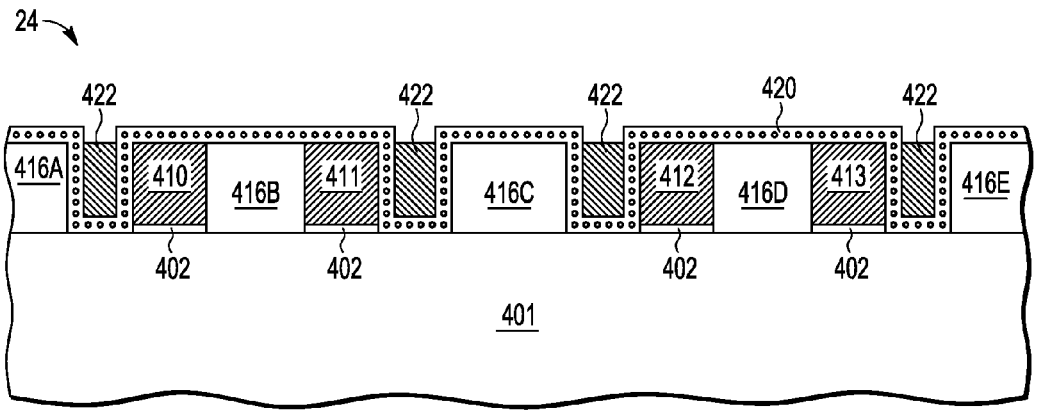

FIG. 15 illustrates processing of the semiconductor structure 24 subsequent to FIG. 14 after forming a charge storage layer 420 and inlaid control gate layer(s) 422 in the control gate openings 419 of the planarized dielectric layer 416. As an initial step, any patterned photoresist/hard mask 418 may be stripped or removed from the planarized dielectric layer 416 and patterned select gate electrode stacks 414, thereby exposing the intended control gate channel regions at the bottom of the control gate openings 419 and at least a side and top surface of each patterned select gate electrode stack. In the control gate openings 419, a nanocrystal stack 420 may be formed over the semiconductor structure 24 using any desired nanocrystal stack formation sequence, such as by depositing one or more insulating layers in which silicon nanocrystals having predetermined diameters and spacing are formed. In other embodiments, other charge storage layers may be formed. The nanocrystal stack 420 may be formed as a conformal layer to cover the control gate channel regions and the top and sides of the patterned select gate electrode stacks 402, 410-413 without completely filling the control gate openings 419 in the planarized dielectric layer 416. In the control gate openings, one or more inlaid control gate layer(s) 422 are formed on the charge storage layer 420, alone or in combination with a control gate barrier metal layer, to cover at least the intended control gate channel regions. As a preliminary step, a control gate barrier metal layer (not shown) may be deposited on the charge storage layer 420. In addition or in the alternative, a control gate layer is formed on the charge storage layer and/or in the control gate openings 419, such as by blanket-depositing a layer of polysilicon to completely fill the control gate openings 419. By applying a planarization step (e.g., a chemical mechanical polish step) to the control gate layer, the inlaid control gate structures 422 may be formed having top surfaces that are substantially co-planar with the top of the patterned select gate layer(s) 410-413 or even lower, depending on the extent of the planarization step. In addition or in the alternative, one or more etch processes may be applied to the control gate layer to form the inlaid control gate structures 422.

As formed, the inlaid control gate structures 422 and associated charge storage layers 420 are formed over the intended control gate channel regions and bounded by the patterned dielectric template features 416A, 416C, 416E and the patterned select gate electrode stacks 414, so that each inlaid control gate is positioned adjacent to a corresponding select gate electrode to form a split-gate NVM bitcell. In addition, each inlaid control gate structure 422 may be formed to include one or more inlaid strap control gate contact regions which are formed at one or more peripheral end or interior positions of the TFS NVM array and bounded by the patterned dielectric template features (e.g., 416C) and/or additional patterned dielectric template features. For example, the interior patterned dielectric template feature 416C may be formed as a plurality of separate dielectric template feature segments (corresponding in position to separate dummy feature segments 312A, 312B with adjacent charge storage layers 319 shown in FIG. 10) with one or more breaks or gaps formed therebetween so as to be spaced apart from one another by a specified strap distance in which the deposited and planarized control gate layer forms an inlaid strap control gate contact region. In addition or in the alternative, one or more additional patterned dielectric template features (corresponding in position to additional dummy template features 216 with adjacent charge storage layers 219 shown in FIG. 8) may be formed at a peripheral end of the TFS NVM array so as to be spaced apart from the peripheral end of the inlaid control gate electrodes 422 by a strap gap having a specified strap distance ($D_{STRAP}$). In the strap gap, the control gate layer is deposited and planarized to form one or more inlaid strap end control gate contact regions which are physically continuous with and electrically connected to an inlaid control gate electrode 422.

Figure 16:
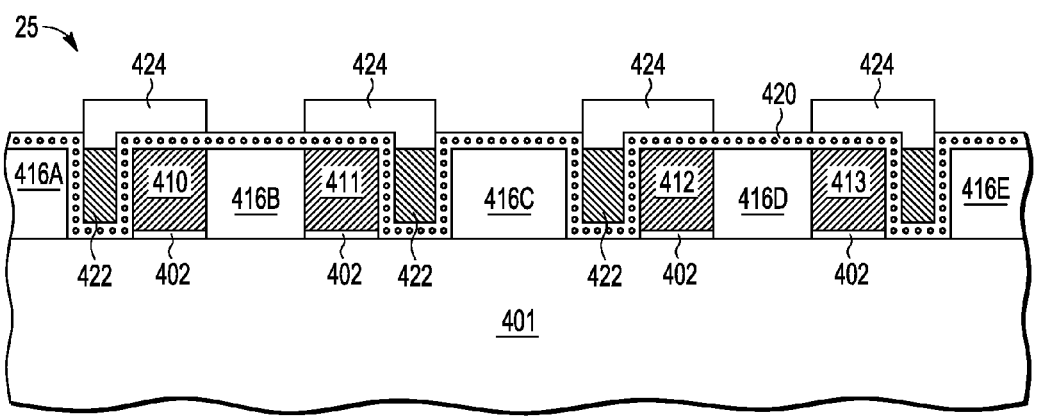

FIG. 16 illustrates processing of the semiconductor structure 25 subsequent to FIG. 15 after a patterned oxide etch mask 424 is formed to protect the split-gate electrode structure and to expose the patterned dielectric features 416A-416E. While any desired etch mask 424 may be formed, in selected embodiments where the patterned dielectric features 416A-416E are formed with oxide layers, a patterned photoresist layer and/or nitride hard mask 424 may be formed which protects the patterned select gate electrode stacks and inlaid control gate layer(s) 422, but otherwise exposes the patterned dielectric features 416A-416E over the intended source and drain regions and any overlying charge storage layer(s) 420. In addition, the openings in the patterned photoresist/nitride hard mask 424 expose the additional dummy dielectric template features (not shown) used to define and delineate the inlaid strap control gate contact regions. In selected embodiments where the patterned select gate layer(s) 410-413 are to be at least partially silicided, the oxide etch mask 424 may be patterned to land midway on the patterned select gate layer(s) 410-413 (not shown), thereby covering only part of the select gate layers 410-413 so that any exposed portions of the charge storage layer(s) 420 may be selectively etched and removed to clear a portion of the select gate layers 410-413 for silicidation. In other embodiments, the charge storage layer(s) 420 may be removed from the top of the select gate layers 410-413 prior to forming the patterned oxide etch mask 424 using any desired etch process, including a dry etch process, a wet etch process, or any combination thereof.

Figure 17:
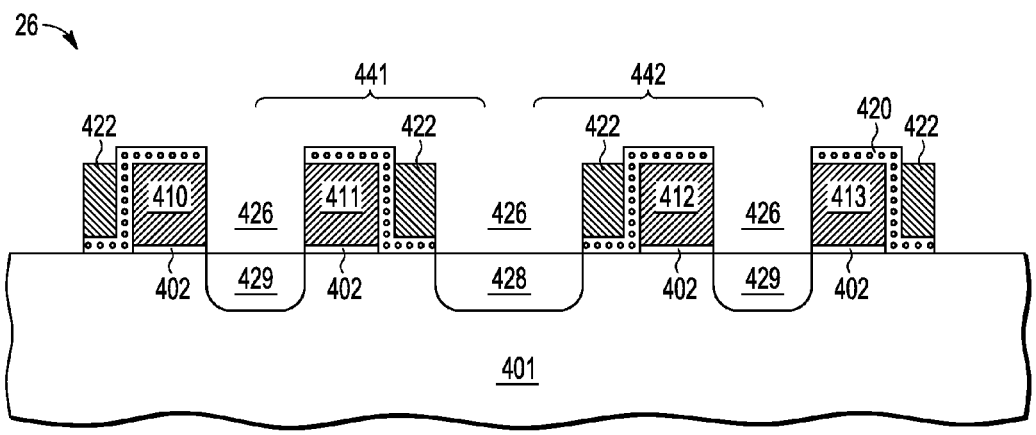

FIG. 17 illustrates processing of the semiconductor structure 26 subsequent to FIG. 16 after removing the exposed patterned dielectric features 416A-416E (and any additional dummy dielectric template features) and forming source and drain regions 428, 429 in the substrate 401. With the patterned photoresist/hard mask 424 in place, the exposed portions of the patterned dielectric features 416A-416E and overlying charge storage layer(s) 420 may be removed with a selective etch process, such as a dry etch or wet etch process, to form source/drain openings 426 between the patterned select gate electrodes and inlaid control gate electrodes. As a result of the selective etch process(es), the patterned dielectric features 416A-416E are removed to expose the intended source regions 428 and drain regions 429. In addition, the additional dummy dielectric template features may be removed, thereby defining the inlaid strap control gate contact regions and inlaid control gates. In an example processing sequence, the source and drain regions 428, 429 may be formed with one or more implantation steps using the patterned oxide etch mask 424 and/or one or more patterned implant masks (not shown) to implant appropriate polarity dopants into the source regions 428 and drain regions 429, depending on the polarity and design of the NVM bitcells.

For purposes of illustrating the placement of the patterned and polished dielectric template features 416A-E and their use in forming the inlaid control gate layers 422 with inlaid control gate contact regions, it will be appreciated that the polished/patterned oxide layers 416A-E could be located to correspond in position to the regions 302, 333, 334, and 340 (shown in FIG. 11) to define oxide trenches in which the control gate layer 422 is subsequently deposited and planarized to form the inlaid control gates 422 and inlaid control gate strap contact region formed between one or more interior positions of the TFS NVM array, followed by selective removal of the polished/patterned oxide layers 416A-E to allow formation of the source/drain implant regions. By way of additional explanation, the placement of the patterned and polished dielectric template features 416A-E for use in forming the inlaid control gate layers 422 with inlaid end cell control gate contact regions may also be understood with reference to FIGS. 8-9, where the polished/patterned oxide layers 416A-E may be located to correspond in position to the dummy select gate regions 212, 216 and dummy control gate regions 222, 225 and surrounding charge storage layers 219 (shown in FIG. 8) to define oxide trenches in which the control gate layer 422 is subsequently deposited and planarized to form the inlaid control gates and inlaid control gate end contact regions 422 (corresponding in position to the inlaid control gates 221, 223, 224, 226 and end cell control gate contact regions 227-229 shown in FIG. 9) after selective removal of the polished/patterned oxide layers 416A-E. By way of still further explanation, the placement of the patterned and polished dielectric template features 416A-E for use in forming the inlaid control gate layers 422 with inlaid strap control gate contact regions may also be understood with reference to FIGS. 10-11, where the polished/patterned oxide layers 416A-E may be located to correspond in position to the dummy select gate regions 312A, 312B and dummy control gate regions 322, 325 and surrounding charge storage layers 319 (shown in FIG. 10) to define oxide trenches in which the control gate layer 422 is subsequently deposited and planarized to form the inlaid control gates and inlaid control gate end contact regions 422 (corresponding in position to the inlaid control gates 321, 323, 324, 326 and inlaid strap control gate contact regions 327 shown in FIG. 11) after selective removal of the polished/patterned oxide layers 416A-E.

After stripping or removing the patterned photoresist/nitride hard mask 424, the resulting semiconductor structure 26 includes an array of split-gate thin film storage non-volatile memory bitcells 441, 442, each of which includes a patterned select gate electrode (e.g., 402, 411), charge storage layer 420, inlaid control gate (e.g., 422), and inlaid strap control gate contact region which is continuously formed as a single word line with the inlaid control gate. As illustrated, columns of select gate electrodes 410, 411, 412, 413 are interlaced with corresponding columns of inlaid control gate electrodes 422 to form an array of split-gate thin film storage non-volatile memory bitcells. The columns of inlaid control gate electrodes 422 are formed by interlacing parallel columns of patterned select gate electrodes 410, 411, 412, 413 with parallel columns of patterned dummy template features 416C so as to be spaced apart from one another by a gap. In each gap, a charge storage layer 420 is formed on the bottom and sidewall surfaces of the gap, and a control gate layer is deposited and planarized to form inlaid control gate electrodes 422. By forming the patterned dummy template features as patterned oxide features instead of patterned poly layers, the dummy template features 416A-E and additional dummy template features may be patterned (and then subsequently removed) using one or more oxide etch processes, thereby eliminating the need for using poly etch process to remove parasitic poly layers (e.g., dummy control gate layers 122, 125 or dummy select gate layers 112) when exposing the source and drain implant regions.

In selected embodiments, the patterned select gate electrodes and/or inlaid control gates may be used to form high-k metal gate electrodes by forming silicide layers or regions on each poly gate electrode layer 410-413, 422, or by using a gate-last method to replace each poly gate electrode layer with a metal gate electrode. In accordance with selected replacement gate embodiments, metal gate electrodes may be formed on the previously formed high-k gate dielectric layers 402 with any desired technique, such as by forming a planarized dielectric layer which exposes at least a top surface of the poly gate electrode layer 410-413, 422, selectively removing the poly gate electrode layer 410-413, 422 from the planarized dielectric layer to form gate electrode openings in the planarized dielectric layer, and then forming one or more metal-based layers (e.g., TiN, TaC, or W) and/or metal gate layers to fill the gate electrode openings. In selected embodiments, the metal gate layer is formed with a conductive material, such as a metal or transition metal material including, as an example, aluminum, tungsten, titanium or TiN, that is formed using metal organic chemical vapor deposition (MOCVD), CVD, PECVD, PVD, ALD, MBD, or any combination(s) thereof to a predetermined thickness in the range of 200-1000 Angstroms (e.g., 500-600 Angstroms), though other materials and thicknesses may be used. The deposited metal interface layer and/or metal gate layer may then be planarized with one or more planarization steps to complete an inlaid or damascene fabrication sequence for forming the HKMG select gate and inlaid control gate electrodes. While any desired planarization process may be used, in accordance with various embodiments, the semiconductor structure may be planarized with one or more polish and/or etch processes, such as using a chemical mechanical polish step to planarize the upper portions of the planarized dielectric layer and gate electrode structures.

Figure 18:
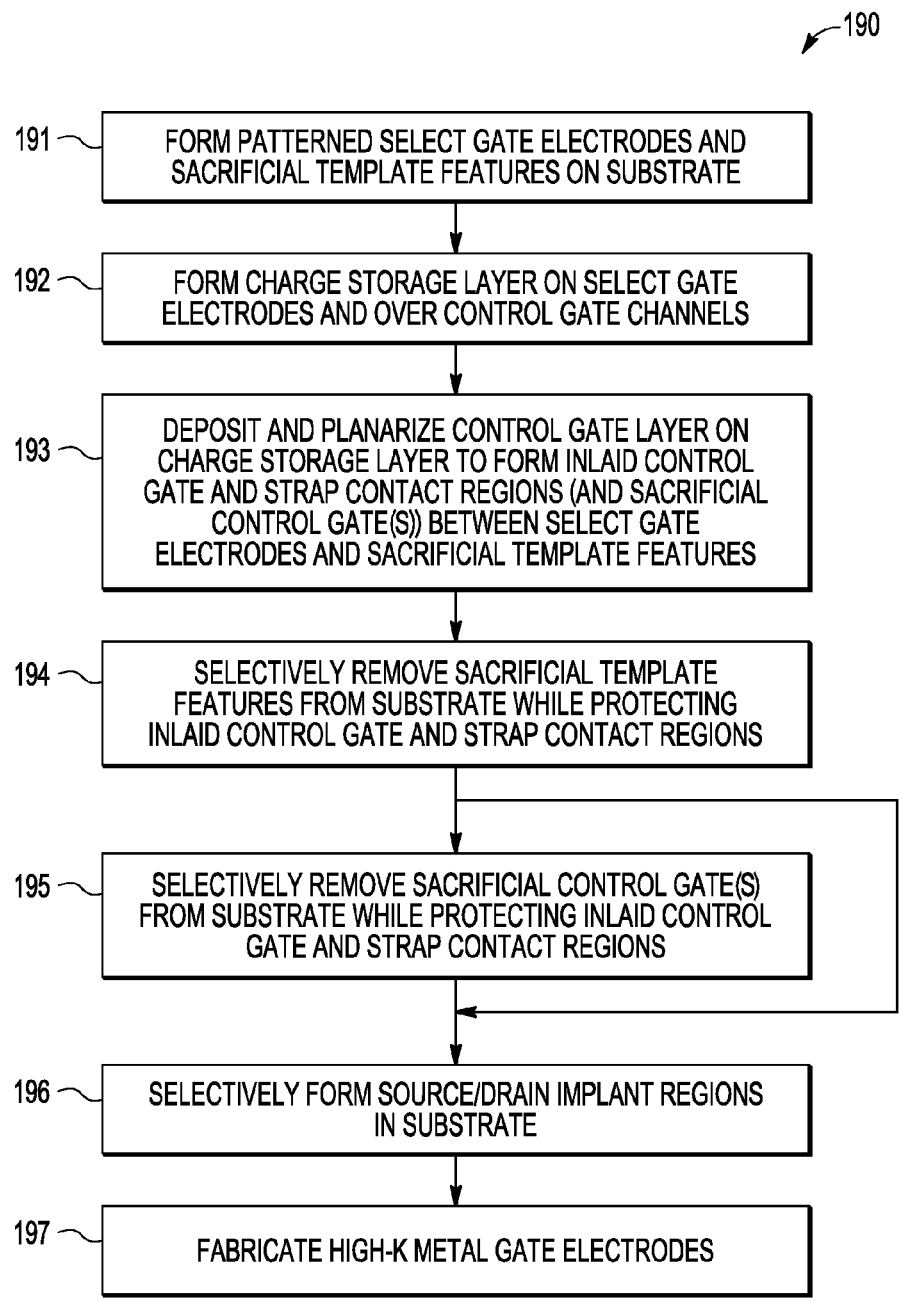
FIG. 18 illustrates an example process flow diagram of a sequence for fabricating split-gate NVM memory cells with inlaid control gates and contact landing sites.

Turning now to FIG. 18, there is shown an example process flow diagram of a fabrication sequence 190 for fabricating a split-gate NVM array with inlaid control gates and contact landing sites. As shown, the process begins during the front end of line (FEOL) process for forming split-gate non-volatile memory cells with one or more gate electrodes fabricated using combination of metal, polysilicon, high-k dielectric layers. During the FEOL process, nonvolatile memory cells are fabricated with select gate electrodes formed adjacent to inlaid control gate electrodes which include one or more inlaid strapped or end cell contact regions which are physically continuous with and electrically connected to the inlaid control gate electrodes. As an initial step 191, patterned select gate electrodes and sacrificial or dummy template features are formed on the substrate. In selected embodiments, the sacrificial template features are formed with one of the patterned select gate electrodes by patterning and etching a select gate electrode stack to form the patterned select gate electrodes and sacrificial template features which are positioned as dummy select gate electrode structures over the intended source regions and separated from adjacent patterned select gate electrodes by a gap in which inlaid control gates will subsequently be formed. In addition, the sacrificial template features include one or more patterned dummy select gate electrodes which are formed at a peripheral end of the split-gate NVM array so as to be spaced apart from the peripheral end of the inlaid control gate electrodes by a gap having a specified distance in which the control gate layer is deposited and planarized to form one or more inlaid strap control gate contact regions which are physically continuous with and electrically connected to an inlaid control gate electrode. For example, patterned select gate electrodes (including one or more patterned dummy select gate electrodes) may be formed by patterning a gate stack which includes a poly layer and a barrier metal layer formed over a high-k gate dielectric layer. In other embodiments, the sacrificial template features are formed by patterning and etching a planarized dielectric layer formed to expose the patterned select gate electrodes, thereby forming control gate openings in the planarized dielectric layer which define patterned dielectric template features and select gate separation features on the substrate.

At step 192, a nanocrystal stack layer or other charge storage layer is formed on the patterned select gate electrodes and any sacrificial template features to cover at least a first sidewall of the patterned select gate electrodes and an adjacent control channel region of the substrate. In forming the nanocrystal stack layer, a first insulating layer may be formed over the substrate, patterned select gate electrodes, and sacrificial template features (e.g., by depositing a high-k dielectric layer or other appropriate insulating layer), on which a layer of conductive nanocrystals and second insulating layer are sequentially formed and then patterned with a selective etch process to form the nanocrystal stack layer on the side of the patterned select gate electrodes and over the control gate channel region.

At step 193, a control gate layer may be deposited and planarized on the charge storage layer to form inlaid control gate and strap contact regions between the patterned select gate electrodes and the sacrificial template features. In selected embodiments, the deposition and planarization of the control gate layer may also form sacrificial control gates between patterned select gate electrodes. For example, a control gate polysilicon layer may be deposited over the substrate using CVD, PECVD, PVD, ALD, or any combination(s) thereof to cover the nanocrystal stack layer which was previously formed on at least a top and side surface of a patterned select gate electrode, such as by forming a conformal polysilicon control gate layer having a controlled thickness so that any openings formed between patterned select gate electrodes and sacrificial template features are completely filled. In addition, the control gate layer may be planarized (e.g., with a chemical mechanical polish process) to form the inlaid control gate and strap contact regions having a top surface or height which substantially coplanar with the top surface or height of the adjacent patterned select gate electrode.

At step 194, the sacrificial template features are selectively removed using one or more etch steps while protecting the inlaid control gate and strap contact regions. For example, if the sacrificial template feature in selected embodiments is a patterned dummy select gate electrode formed with a patterned poly layer, a poly etch process may be applied in combination with a poly etch mask to remove the patterned dummy select gate electrode and thereby expose the intended source region. However, if the sacrificial template feature in other embodiments is a patterned dielectric template feature formed with a patterned oxide layer, an oxide etch process may be applied in combination with an oxide etch mask to remove the patterned dielectric template feature and thereby expose the intended source region.

In the event that sacrificial control gates are formed at step 193 when depositing and planarizing the control gate layer, the sacrificial control gates may be selectively removed at step 195 using one or more etch steps while protecting the inlaid control gate and strap contact regions. For example, a poly etch process may be applied in combination with a poly etch mask to remove any inlaid sacrificial control gates and thereby expose the intended drain region(s). However and as indicated by the bypass line, step 195 may be omitted in embodiments were sacrificial template features are formed in place of the sacrificial control gates.

At step 196, source/drain implant regions are selectively formed in the substrate. For example, source and drain regions may be formed by implanting appropriate source/drain impurities around the patterned select gate electrodes and inlaid control gates after removing the sacrificial template features (including any sacrificial control gate) to expose the source and drain implant regions, alone or in combination with one or more implant masks.

At step 197, high-k metal gate electrodes and/or strap contact regions are formed by forming silicide layers or regions on exposed poly gate layers (including but not limited to a select gate layer, inlaid control gate layer, and/or inlaid strap contact region), or by using a gate-last method to replace a poly gate layer (including but not limited to a select gate layer, inlaid control gate layer, and/or inlaid strap contact region) with a metal gate electrode. In selected example embodiments of a gate-last methodology, a planarized dielectric layer is formed to expose the topmost surfaces of the patterned select gate electrodes, inlaid control gate layers, and/or inlaid strap contact regions. Thus exposed, the patterned select gate electrodes, inlaid control gate layers, and/or inlaid strap contact regions are selectively removed using one or more poly etch steps to form gate electrode openings in the planarized dielectric/oxide layer. In addition, one or more additional oxide etch steps may also be applied to remove one or both of the underlying barrier metal layer and gate dielectric layer in the gate electrode openings. In the gate electrode openings, high-k metal gate (HKMG) electrodes and strap contact regions are formed using a replacement gate method. While different materials and processes may be used, the HKMG electrodes and strap contact regions may be formed by depositing and planarizing at least a first metal interface layer and metal-based gate electrode layer in the gate electrode openings. If required, one or more gate dielectric layers may be formed in the gate electrode openings prior to forming the first metal interface layer and metal-based gate electrode layer, such as be depositing or forming a high-k gate dielectric layer and barrier metal layer in the gate electrode openings. Subsequently, additional back end of line (BEOL) processing may be performed to deposit one or more additional interlayer dielectric layers and metal interconnect structures to make electrical contact with contacts formed at the split-gate nonvolatile memory cells and NMOS/PMOS transistors.

As seen from above, the fabrication sequence 190 is described with reference to forming sacrificial template features (e.g., dummy select gate electrodes or patterned dielectric template features) which are spaced apart from the patterned select gate electrodes by a specified strap distance and used to define and delineate inlaid control gate strap regions when the inlaid control gates are formed. However, it will be appreciated that various benefits of the present disclosure may also be obtained by using other sacrificial or dummy template structures to form the inlaid control gate or select gate strop regions. In addition, it will be appreciated that other types of split-gate NVM bitcell devices may be formed with different sequencing and/or materials. And though selected embodiments are described for using a split-gate NVM cell with a storage layer containing conductive nanoclusters, any desired NVM cell structures may also be used, provided that the spacer control gate electrodes are protected during formation of the replacement select gates and CMOS transistor gates. Examples of alternative NVM cells include a split-gate cell utilizing a nitride storage layer, discrete storage element layers, and the like.

By now it should be appreciated that there is provided herein a semiconductor fabrication process forming gate-strapped non-volatile memory devices in an HKMG CMOS process. In the disclosed process, a first select gate structure and one or more sacrificial structures are formed over the semiconductor substrate. As formed, the one or more sacrificial structures are spaced apart from the first select gate structure on a first side to form a control gate opening. In addition, the one or more sacrificial structures are positioned in relation to the first select gate structure to define a control gate contact opening. In selected embodiments, the first select gate structure and one or more sacrificial structures may be formed by sequentially forming one or more gate dielectric layers and a polysilicon layer to cover the semiconductor substrate, and then patterning the polysilicon layer and one or more gate dielectric layers to form the first select gate structure with a first patterned polysilicon layer and to form the one or more sacrificial structures with one or more additional patterned polysilicon layers. As formed, the additional patterned polysilicon layers may include a first additional patterned polysilicon layer that is laterally spaced apart from the first select gate structure on the first side to form the control gate opening, and a second additional patterned polysilicon layer that is orthogonally spaced apart from a peripheral end of the first additional patterned polysilicon layer to form the control gate contact opening. In other embodiments, the first select gate structure and one or more sacrificial structures may be formed by first forming a plurality of patterned select gate electrodes on the semiconductor substrate, and then forming a planarized dielectric layer over the semiconductor substrate which exposes an upper surface of the plurality of patterned select gate electrodes. By patterning the planarized dielectric layer to protect the plurality of patterned select gate electrodes and form openings in the planarized dielectric layer, the one or more sacrificial structures may be formed to include a first patterned dielectric layer that is laterally spaced apart from the first select gate structure on the first side to form the control gate opening, and a second patterned dielectric layer that is orthogonally spaced apart from a peripheral end of the first patterned dielectric layer to form the control gate contact opening. In any case, the control gate contact opening may be formed at a peripheral end of a non-volatile memory array (to form a strap end control gate contact region), or may be formed at an interior position of a non-volatile memory array (to form an interior strap control gate contact region). Subsequently, a charge storage layer (e.g., a nanocrystal stack) is formed on at least a top and sidewall surface(s) of the first select gate structure and on a bottom surface of the control gate opening. In the control gate opening and control gate contact opening, an inlaid control gate and an inlaid control gate contact layer are simultaneously formed as a single continuous conductive layer by forming a planarized conductive layer on the charge storage layer to fill the control gate opening and control gate contact opening. In selected embodiments, the inlaid control gate and inlaid control gate contact layer may be simultaneously formed by depositing a barrier metal layer and a polysilicon layer to completely fill the control gate opening and control gate contact opening, and then polishing the polysilicon layer and barrier metal layer to form the inlaid control gate in the control gate opening and the inlaid control gate contact layer in the control gate contact opening as a single continuous conductive layer. In addition, at least part of the one or more sacrificial structures may be selectively removed to expose intended source and/or drain regions of the semiconductor substrate for implantation with one or more implantation steps to form source and/or drain regions in the semiconductor substrate. In selected embodiments, at least part of the one or more sacrificial structures may be selectively removed by applying one or more poly etch processes to remove a sacrificial select gate electrode and a sacrificial control gate electrode. In other embodiments, at least part of the one or more sacrificial structures may be selectively removed by applying one or more oxide etch processes to remove one or more sacrificial structures formed with patterned oxide template features without requiring a poly etch process.

In another form, there is disclosed a memory cell having an inlaid control gate and an inlaid control gate contact and associated method of forming same. In the disclosed methodology and memory cell, a semiconductor substrate is provided as a wafer. On the wafer, a select gate structure and a sacrificial structure are formed so that the sacrificial structure is spaced apart from the select gate structure on a first side to form a control gate opening, and so that the sacrificial structure is positioned in relation to the select gate structure to define a control gate contact opening. In selected embodiments, the select gate structure and sacrificial structure are formed using a single masking step which lithographically defines (i) a gate length and width of the select gate structure, (ii) a gate length of an inlaid control gate yet to be formed, and (iii) a strap gap distance $D_{STRAP}$ of an inlaid control gate contact yet to be formed. In addition, a second sacrificial structure may be formed over a drain area of the semiconductor substrate adjacent to the select gate structure which is used during formation of the inlaid control gate and an inlaid control gate contact before being removed prior to forming the drain in the semiconductor substrate. In selected embodiments, the select gate structure and sacrificial structure are formed by sequentially forming one or more gate dielectric layers and a polysilicon layer to cover the semiconductor substrate, and then patterning the polysilicon layer and one or more gate dielectric layers to form the select gate structure with a first patterned polysilicon layer and to form the sacrificial structure with one or more additional patterned polysilicon layers. As formed, the sacrificial structure includes a first additional patterned polysilicon layer that is laterally spaced apart from the select gate structure on the first side to form the control gate opening, and a second additional patterned polysilicon layer that is orthogonally spaced apart from a peripheral end of the first additional patterned polysilicon layer to form the control gate contact opening. In other embodiments, the select gate structure and sacrificial structure may be formed by first forming a pair of patterned select gate structures on the semiconductor substrate, and then forming a planarized dielectric layer over the semiconductor substrate which exposes an upper surface of the pair of patterned select gate structures. By patterning the planarized dielectric layer to protect the pair of patterned select gate structures and form openings in the planarized dielectric layer, the sacrificial structure may be formed to include a first patterned dielectric layer that is laterally spaced apart from the select gate structure on the first side to form the control gate opening, and a second patterned dielectric layer that is orthogonally spaced apart from a peripheral end of the first patterned dielectric layer to form the control gate contact opening. In any case, the control gate contact opening may be formed at a peripheral end of a non-volatile memory array (to form a strap end control gate contact region), or may be formed at an interior position of a non-volatile memory array (to form an interior strap control gate contact region). After forming the control gate opening, a charge storage layer having a plurality of discrete storage elements is formed to line the control gate opening. On the charge storage layer, a conductive layer is deposited to fill the control gate opening and the control gate contact opening, and is planarized to form the inlaid control gate in the control gate opening and the inlaid control gate contact in the control gate contact opening. Subsequently, the sacrificial structure is removed with a selective etch while protecting the inlaid control gate and inlaid control gate contact with one or more etch mask layers. In addition, a source is formed in the semiconductor substrate adjacent to the inlaid control gate, and a drain is formed in the semiconductor substrate adjacent to the select gate structure.

In yet another form, there is provided a semiconductor device with integrated transistors and non-volatile memory cells and associated method for fabricating same. As disclosed, the semiconductor device includes a semiconductor substrate. The semiconductor device also includes a non-volatile polysilicon discrete storage element split-gate bitcell array formed on the semiconductor substrate surface. The split-gate bitcell array includes a plurality of select gate electrodes disposed in a parallel pattern over the semiconductor substrate. The split-gate bitcell array also includes a plurality of charge storage structures including discrete storage elements, with each charge storage structure being disposed adjacent to at least a sidewall surface of a corresponding select gate electrode and to extend over a control channel region in the semiconductor substrate adjacent to the corresponding select gate electrode. In addition, the split-gate bitcell array includes a plurality of inlaid control gate electrodes, each disposed adjacent to a corresponding charge storage structure located on a sidewall surface of a corresponding select gate electrode. Finally, the split-gate bitcell array includes one or more inlaid control gate contacts formed with the plurality of inlaid control gate electrodes as a single continuous conductive layer (e.g., with planarized polysilicon). As disclosed herein, the inlaid control gate contacts may be formed as strapped or end cell contacts.

Although the described exemplary embodiments disclosed herein are directed to various semiconductor device structures and methods for making split-gate TFS NVM bitcells with inlaid control gates and strapped or end cell contacts, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various poly gate electrode devices are illustrated as being split-gate flash memory devices, this is merely for convenience of explanation and not intended to be limiting and persons of skill in the art will understand that the principles taught herein apply to devices of other types of gate electrodes. Accordingly, other types of poly gate devices may be formed on-chip with metal-gate electrodes as disclosed herein. Moreover, the thicknesses and doping concentrations of the described layers may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
    forming a first select gate structure and one or more sacrificial structures over the semiconductor substrate, where the one or more sacrificial structures are spaced apart from the first select gate structure on a first side to form a control gate opening, and where the one or more sacrificial structures are positioned in relation to the first select gate structure to define a control gate contact opening;
    forming a charge storage layer on at least a top and sidewall surface of the first select gate structure and on a bottom surface of the control gate opening; and
    simultaneously forming an inlaid control gate in the control gate opening and an inlaid control gate contact layer in the control gate contact opening as a continuous conductive layer by forming a planarized conductive layer on the charge storage layer to fill the control gate opening and control gate contact opening.

2. The semiconductor fabrication process of claim 1, further comprising:
    selectively removing at least part of the one or more sacrificial structures to expose intended source and/or drain regions of the semiconductor substrate; and
    implanting the intended source and/or drain regions with one or more implantation steps to form source and/or drain regions in the semiconductor substrate.

3. The semiconductor fabrication process of claim 1, where forming the first select gate structure and one or more sacrificial structures comprises:
    forming one or more gate dielectric layers on the semiconductor substrate;
    forming a polysilicon layer on the one or more gate dielectric layers to cover the semiconductor substrate; and
    patterning the polysilicon layer and one or more gate dielectric layers to form the first select gate structure with a first patterned polysilicon layer and to form the one or more sacrificial structures with one or more additional patterned polysilicon layers comprising:
    a first additional patterned polysilicon layer that is laterally spaced apart from the first select gate structure on the first side to form the control gate opening, and
    a second additional patterned polysilicon layer that is orthogonally spaced apart from a peripheral end of the first additional patterned polysilicon layer to form the control gate contact opening.

4. The semiconductor fabrication process of claim 3, where the control gate contact opening is formed at a peripheral end of a non-volatile memory array.

5. The semiconductor fabrication process of claim 3, where the control gate contact opening is formed at an interior position of a non-volatile memory array.

6. The semiconductor fabrication process of claim 1, where forming the first select gate structure and one or more sacrificial structures comprises:
    forming a plurality of patterned select gate electrodes on the semiconductor substrate;
    forming a planarized dielectric layer over the semiconductor substrate which exposes an upper surface of the plurality of patterned select gate electrodes;
    patterning the planarized dielectric layer to protect the plurality of patterned select gate electrodes and form the one or more sacrificial structures comprising:
    a first patterned dielectric layer that is laterally spaced apart from the first select gate structure on the first side to form the control gate opening, and
    a second patterned dielectric layer that is orthogonally spaced apart from a peripheral end of the first patterned dielectric layer to form the control gate contact opening.

7. The semiconductor fabrication process of claim 6, where the control gate contact opening is formed at a peripheral end of a non-volatile memory array.

8. The semiconductor fabrication process of claim 6, where the control gate contact opening is formed at an interior position of a non-volatile memory array.

9. The semiconductor fabrication process of claim 1, where forming the charge storage layer comprises forming a nanocrystal stack to cover the top and sidewall surfaces of the first select gate structure and the bottom surface of the control gate opening.

10. The semiconductor fabrication process of claim 1, where simultaneously forming the inlaid control gate and inlaid control gate contact layer comprises:
    depositing a barrier metal layer and a polysilicon layer to completely fill the control gate opening and control gate contact opening; and
    polishing the polysilicon layer and barrier metal layer to form the inlaid control gate in the control gate opening and the inlaid control gate contact layer in the control gate contact opening as a continuous conductive layer.

11. A method of forming a memory cell comprising an inlaid control gate and an inlaid control gate contact, comprising:
    forming a select gate structure and a sacrificial structure over a semiconductor substrate, where the sacrificial structure is spaced apart from the select gate structure on a first side to form a control gate opening, and where the sacrificial structure is positioned in relation to the select gate structure to define a control gate contact opening;
    lining the control gate opening with a charge storage layer comprising a plurality of discrete storage elements; and
    depositing a conductive layer on the charge storage layer to fill the control gate opening and the control gate contact opening;
    planarizing the conductive layer to form the inlaid control gate in the control gate opening and the inlaid control gate contact in the control gate contact opening;
    removing the sacrificial structure with a selective etch while protecting the inlaid control gate and inlaid control gate contact with one or more etch mask layers;
    forming a source in the semiconductor substrate adjacent to the inlaid control gate; and
    forming a drain in the semiconductor substrate adjacent to the select gate structure.

12. The method of claim 11, where forming the select gate structure and sacrificial structure comprises using a single masking step which lithographically defines (i) a gate length and width of the select gate structure, (ii) a gate length of an inlaid control gate yet to be formed, and (iii) a strap gap distance $D_{STRAP}$ of an inlaid control gate contact yet to be formed.

13. The method of claim 11, where forming the select gate structure and sacrificial structure comprises forming a second sacrificial structure over a drain area of the semiconductor substrate adjacent to the select gate structure; and removing the second sacrificial structure prior to forming the drain in the semiconductor substrate.

14. The method of claim 11, where forming the select gate structure and sacrificial structure comprises:
   forming one or more gate dielectric layers on the semiconductor substrate;
   forming a polysilicon layer on the one or more gate dielectric layers; and
   patterning the polysilicon layer and one or more gate dielectric layers to form the select gate structure with a first patterned polysilicon layer and to form the sacrificial structure with one or more additional patterned polysilicon layers comprising:
      a first additional patterned polysilicon layer that is laterally spaced apart from the select gate structure on the first side to form the control gate opening, and
      a second additional patterned polysilicon layer that is orthogonally spaced apart from a peripheral end of the first additional patterned polysilicon layer to form the control gate contact opening.

15. The method of claim 14, where the control gate contact opening is formed at a peripheral end of a non-volatile memory array.

16. The method of claim 14, where the control gate contact opening is formed at an interior position of a non-volatile memory array.

17. The method of claim 11, where forming the select gate structure and sacrificial structure comprises:
   forming a pair of patterned select gate structures on the semiconductor substrate;
   forming a planarized dielectric layer over the semiconductor substrate where an upper surface of the pair of patterned select gate structures is exposed; and
   patterning the planarized dielectric layer to protect the pair of patterned select gate structures and form the sacrificial structure comprising:
      a first patterned dielectric layer that is laterally spaced apart from the select gate structure on the first side to form the control gate opening, and
      a second patterned dielectric layer that is orthogonally spaced apart from a peripheral end of the first patterned dielectric layer to form the control gate contact opening.

18. A semiconductor device, comprising:
   a semiconductor substrate;
   a non-volatile polysilicon discrete storage element split-gate bitcell array formed on the semiconductor substrate surface, comprising:
   a plurality of select gate electrodes disposed in a parallel pattern over the semiconductor substrate;
   a plurality of charge storage structures, each comprising a plurality of discrete storage elements and disposed adjacent to at least a sidewall surface of a corresponding select gate electrode and to extend over a control channel region in the semiconductor substrate adjacent to the corresponding select gate electrode;
   a plurality of inlaid control gate electrodes, each disposed adjacent to a corresponding charge storage structure located on a sidewall surface of a corresponding select gate electrode; and
   one or more inlaid control gate contacts formed with the plurality of inlaid control gate electrodes as a continuous conductive layer.

19. The semiconductor device of claim 18, where the plurality of inlaid control gate electrodes and one or more inlaid control gate contacts are formed with planarized polysilicon.

20. The semiconductor device of claim 18, where the one or more inlaid control gate contacts are formed as strapped or end cell contacts.

* * * * *